(12) United States Patent
Jo et al.

(10) Patent No.: US 11,157,425 B2
(45) Date of Patent: Oct. 26, 2021

(54) MEMORY DEVICE, MEMORY SYSTEM INCLUDING MEMORY DEVICE AND VEHICLE-BASED SYSTEM INCLUDING MEMORY SYSTEM

(71) Applicant: SAMSUNG ELECTRONICS CO., LTD., Suwon-si (KR)

(72) Inventors: Youngmin Jo, Hwaseong-si (KR); Daeseok Byeon, Seongnam-si (KR); Tongsung Kim, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 17 days.

(21) Appl. No.: 16/853,807

(22) Filed: Apr. 21, 2020

(65) Prior Publication Data

US 2021/0133128 A1   May 6, 2021

(30) Foreign Application Priority Data

Nov. 1, 2019   (KR) .......................... 10-2019-0138720

(51) Int. Cl.
| | | |
|---|---|---|
| *G06F 13/16* | (2006.01) | |
| *G06N 3/04* | (2006.01) | |
| *H01L 25/065* | (2006.01) | |
| *H01L 25/18* | (2006.01) | |

(52) U.S. Cl.
CPC .......... *G06F 13/1673* (2013.01); *G06N 3/04* (2013.01); *H01L 25/0652* (2013.01); *H01L 25/18* (2013.01); *H01L 2225/06506* (2013.01); *H01L 2225/06541* (2013.01); *H01L 2225/06562* (2013.01)

(58) Field of Classification Search
CPC ...... G06F 13/16; G06F 13/1673; G06F 13/18; H01L 26/0662; H01L 26/10; H01L 2226/06562; H01L 2226/05506; H01L 2226/06541
See application file for complete search history.

(56) References Cited

U.S. PATENT DOCUMENTS

| | | | |
|---|---|---|---|
| 9,053,066 B2 | 6/2015 | Ramachandra et al. | |
| 9,696,934 B2 | 7/2017 | Rothbert | |
| 10,185,516 B2* | 1/2019 | Um ....................... | G06F 3/0679 |
| 10,216,422 B2 | 2/2019 | Kim et al. | |

(Continued)

OTHER PUBLICATIONS

U.S. Office Action dated Jun. 25, 2021 in Related U.S. Appl. No. 17/027,978.

*Primary Examiner* — Henry Tsai
*Assistant Examiner* — Christopher A Daley
(74) *Attorney, Agent, or Firm* — Volentine, Whitt & Francos, PLLC

(57) ABSTRACT

A memory device provides a first memory area and a second memory area. A smart buffer includes; a priority setting unit receiving sensing data and a corresponding weight, determining a priority of the sensing data based on the corresponding weight, and classifying the sensing data as first priority sensing data or second priority sensing data based on the priority, and a channel controller allocating a channel to a first channel group, allocating another channel to a second channel group, assigning the first channel group to process the first priority sensing data in relation to the first memory area, and assigning the second channel group to process the second priority sensing data in relation to the second memory area.

20 Claims, 21 Drawing Sheets

(56) References Cited

U.S. PATENT DOCUMENTS

| | | | |
|---|---|---|---|
| 2009/0083517 A1* | 3/2009 | Riddle | G06F 9/526 |
| | | | 712/30 |
| 2009/0154407 A1* | 6/2009 | Jeong | H04W 48/08 |
| | | | 370/329 |
| 2015/0278104 A1* | 10/2015 | Moon | G06F 3/065 |
| | | | 711/135 |
| 2015/0324296 A1 | 11/2015 | Cui et al. | |
| 2016/0035711 A1 | 2/2016 | Hu | |
| 2016/0121558 A1* | 5/2016 | Munaux | G05B 19/4097 |
| | | | 700/97 |
| 2016/0181214 A1 | 6/2016 | Oh | |
| 2017/0010815 A1 | 1/2017 | Sprouse et al. | |
| 2017/0315755 A1* | 11/2017 | Smith | G06F 3/064 |
| 2017/0337010 A1* | 11/2017 | Kriss | H04L 49/3036 |
| 2018/0143762 A1 | 5/2018 | Kim et al. | |
| 2018/0173655 A1 | 6/2018 | Achtenberg et al. | |
| 2019/0051361 A1 | 2/2019 | Park | |
| 2019/0130265 A1 | 5/2019 | Ling | |
| 2020/0091029 A1 | 3/2020 | Jeng | |
| 2020/0244600 A1* | 7/2020 | Shani | H04L 67/1097 |
| 2020/0371715 A1* | 11/2020 | Lee | G06F 3/0631 |

\* cited by examiner

| SENSING DATA | | | |
|---|---|---|---|
| DRIVING ENVIRONMENT | SENSOR TYPE | SENSOR | WEIGHT |
| DAYTIME FORWARD DRIVING | IMAGE SENSOR | RGB SENSOR | 1.00 |
| | | IR SENSOR | 0.85 |
| | SPEED SENSOR | ACCELERATION SENSOR | 1.00 |
| NIGHTTIME FORWARD DRIVING | IMAGE SENSOR | RGB SENSOR | 0.75 |
| | | IR SENSOR | 1.10 |
| | SPEED SENSOR | ACCELERATION SENSOR | 1.00 |
| DAYTIME BACKWARD DRIVING | IMAGE SENSOR | RGB SENSOR | 1.15 |
| | | IR SENSOR | 0.95 |
| | DISTANCE SENSOR | LIDAR | 1.15 |
| | | ULTRASONIC SENSOR | 0.90 |
| NIGHTTIME BACKWARD DRIVING | IMAGE SENSOR | RGB SENSOR | 0.85 |
| | | IR SENSOR | 1.20 |
| | DISTANCE SENSOR | LIDAR | 0.80 |
| | | ULTRASONIC SENSOR | 1.10 |

FIG. 4

MEMORY DEVICE, MEMORY SYSTEM INCLUDING MEMORY DEVICE AND VEHICLE-BASED SYSTEM INCLUDING MEMORY SYSTEM

CROSS-REFERENCE TO RELATED APPLICATION(S)

This application claims priority to Korean Patent Application No. 10-2019-0138720 filed on Nov. 1, 2019 in the Korean Intellectual Property Office, the subject matter of which is hereby incorporated by reference.

BACKGROUND

The inventive concept relates to memory device(s) and memory system(s) including same.

As the automotive electronics market develops, various kinds of sensors such as image sensors, radars, lidars, and the like, have been installed in automobiles. As a result of the large volume of resulting sensing data, more efficient memory devices are required. Such memory devices must be able to transmit, receive, store and/or retrieve data to provide faster data processing and data transmission speeds. Unfortunately, conventional memory devices cannot provide the required data processing and data transmission speeds without becoming too costly and/or too physically large. In addition, conventional memory devices cannot readily provide sufficient data transmission channels.

SUMMARY

In one aspect embodiments of the inventive concept provide a memory device including a smart buffer capable of classifying sensing data according to its relative importance. In another aspect embodiments of the inventive concept provide a memory device capable of allocating transmission channels for the sensing data according to its relative importance.

According to an aspect of the inventive concept, a memory device includes a smart buffer, and a general memory area divided into a first memory area and a second memory area. The smart buffer includes; a priority setting unit configured to receive sensing data and a corresponding weight from a controller, determine a priority of the sensing data based on the weight, and classify the sensing data as one of first priority sensing data and second priority sensing data, and a channel controller configured to allocate at least one channel selected from among a plurality of channels to a first channel group, allocate at least another channel selected from among the plurality of channels to a second channel group, assign the first channel group to process the first priority sensing data in relation to the first memory area, and assign the second channel group to process the second priority sensing data in relation to the second memory area, wherein a number of data input/output (I/O) pins connected to the second channel group is greater than a number of data I/O pins connected to the first channel group.

According to another aspect of the inventive concept, a memory device includes; a memory package including a smart buffer and a plurality of semiconductor chips mounted on a semiconductor substrate, wherein the smart buffer is implemented on a semiconductor chip different from the plurality of semiconductor chips and the plurality of semiconductor chips provide a plurality of memory areas including a first memory area and a second memory area, wherein the smart buffer includes; a priority setting unit configured to receive sensing data and a corresponding weight obtained by performing a neural network operation on the sensing data, determine a priority of the sensing data based on the corresponding weight, and classify the sensing data as one of first priority sensing data and second priority sensing data based on the priority, and a channel controller configured to allocate at least one channel selected from among a plurality of channels to a first channel group, allocate at least another channel selected from among the plurality of channels to a second channel group, assign the first channel group to process the first priority sensing data in relation to the first memory area, and assign the second channel group to process the second priority sensing data in relation to the second memory area.

According to another aspect of the inventive concept, a memory system includes; a controller including a weight calculator configured to calculate a corresponding weight for sensing data using a neural network operation, and a memory device. The memory device includes; a general memory area divided into a plurality of memory areas including a first memory area and a second memory area, and a smart buffer. The smart buffer includes; a priority setting unit configured to receive the sensing data and the corresponding weight, determine a priority of the sensing data based on the corresponding weight, and classify the sensing data as one of first priority sensing data and second priority sensing data based on the priority, and a channel controller configured to allocate at least one channel selected from among a plurality of channels to a first channel group, allocate at least another channel selected from among the plurality of channels to a second channel group, assign the first channel group to process the first priority sensing data in relation to the first memory area, and assign the second channel group to process the second priority sensing data in relation to the second memory area.

According to another aspect of the inventive concept, a vehicle-based system including sensors disposed in a vehicle and providing sensing data to a memory system including a controller and a memory device. The controller includes a weight calculator configured to calculate a corresponding weight for the sensing data using a mapping table. The memory device includes; a general memory area divided into a plurality of memory areas including a first memory area and a second memory area and a smart buffer. The smart buffer includes; a priority setting unit configured to receive the sensing data and the corresponding weight, determine a priority of the sensing data based on the corresponding weight, and classify the sensing data as one of first priority sensing data and second priority sensing data based on the priority, and a channel controller configured to allocate at least one channel selected from among a plurality of channels to a first channel group, allocate at least another channel selected from among the plurality of channels to a second channel group, assign the first channel group to process the first priority sensing data in relation to the first memory area, and assign the second channel group to process the second priority sensing data in relation to the second memory area.

BRIEF DESCRIPTION OF DRAWINGS

The above and other aspects, features, and advantages of the inventive concept will be clearly understood upon consideration of the following detailed description taken together with the accompanying drawings, in which:

FIGS. 2 to 4 are views illustrating a memory system according to an embodiment of the inventive concept.

DETAILED DESCRIPTION

Hereinafter, embodiments of the inventive concept will be described in some additional detail with reference to the accompanying drawings. Throughout the drawings, like reference numbers and labels are used to denote like components.

Figure 1:
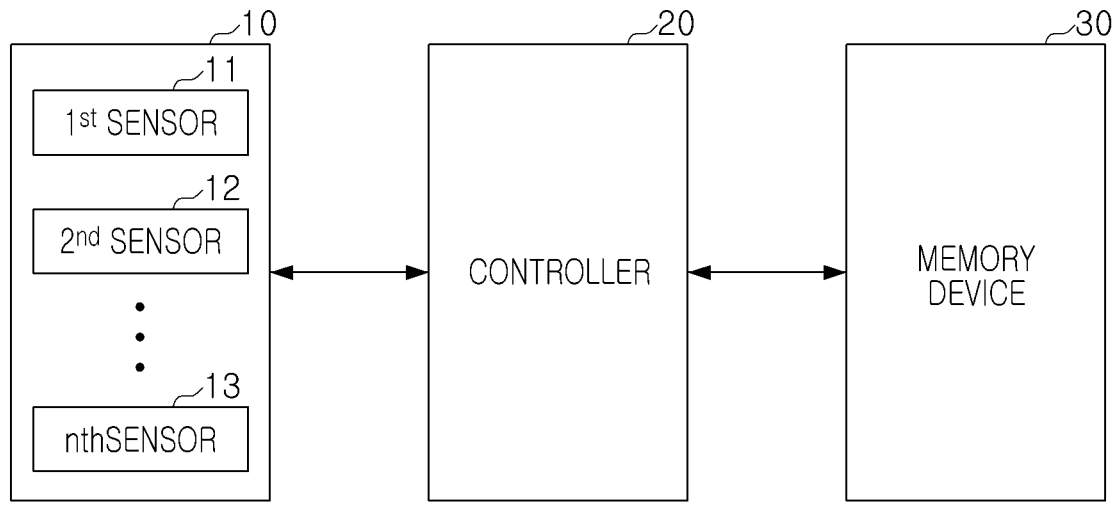
FIG. 1 is a simplified view illustrating a computing system according to an embodiment of the inventive concept.

FIG. 1 is a general block diagram illustrating a computing system 1 according to an embodiment of the inventive concept.

Referring to FIG. 1, the computing system 1 may include a sensor unit 10, a controller 20, and a memory device 30.

The sensor unit 10 may include a plurality of sensors 11, 12 and 13 (hereafter, "sensors"). The sensors (e.g., 1st through nth sensors, including sensors 11, 12 and 13) may be one or more of a variety of well understood sensor types, including image sensors, speed sensors, light sensors, temperature sensors, distance sensors, etc. The sensor unit 10 may process and/or aggregate various "sensing data" provided by the sensors. For example, the sensor unit 10 may receive, process and/or aggregate visual information, motion information, incident light information, temperature information, spatial relationship(s) information, etc. provided by the sensors. In this regard, the sensor unit 10 may be implemented in hardware, software or a combination of both. The sensor unit 10 may be implemented as a unitary component or a set of components, within the computing system 1, and one or more of the components may be a distributed component. Respective sensors among the sensors may provide sensing data in a variety of formats and/or using a variety of data transmission protocols. Nonetheless, once processed and/or aggregated by the sensor unit 10, the sensing data may be provided to the controller 20.

The sensors (e.g., 11, 12 and 13) may be variously mounted on, or disposed within a vehicle in cases where the computing system 1 is a vehicle-based computing system used to process various data related to the status of, and the ongoing operation of the vehicle. In this regard, some of the sensors may be factory installed in the vehicle, while one or more of the sensors may installed (or temporarily disposed) after-market in the vehicle by the user or owner of the vehicle. For example, a sensor may be configured and connected via a wireless network connected to the internet. As such, the computing system 1 may be, wholly or in part, an internet of things (IoT) component or node.

The controller 20 may assign a weight (or weighting factor) to the sensing data received from the sensor unit 10. In an embodiment, the controller 20 may include a neural network circuit that may be used to calculate or determine an appropriate weight to various sensing data. The neural network circuit may be a circuit engineering-modeled from an operation structure of a human brain, and may include, for example, a convolutional neural network (CNN) model, a recurrent neural network (RNN) model, a generative adversarial network (GAN) model, and the like.

Once the sensing data is weighted by the controller 20, the resulting weighted sensing data may transferred to the memory device 30, along with associated commands, requests and/or address(es). The weighted sensing data may be accessed by the memory device 30 using commonly recognized data access operations, such as a write (or program) operation, a read operation, an erase operation, etc. The controller 20 may exchange data with the sensor unit 10 and/or the memory device 30 using one or more interface(s).

The memory device 30 may include a plurality of memory areas variously configured to store weighted sensing data, as well as a number of channels variously configured to transmit and/or receive (hereafter, "transmit/receive") the weighted sensing data. Each of the channels may be associated (or used in conjunction) with one or more memory area(s), where each memory area has a defined data storage capacity. In this regard, the memory device 30 may variously group the channels to logically divide the plurality of memory areas. For example, the memory device 30 may group channels into a first channel group, a second channel group, and so on.

The data processing speed and/or the data transmission speed of a respective memory area among the plurality of memory areas may vary with the assignment (or allocation) of a particular channel group. For example, a first memory area (e.g., a memory area including NAND flash memory cells operated as single-level memory cells (SLC)) may be assigned a first channel group, and may therefore exhibit a first data processing speed and a first data transmission speed. Whereas, a second memory area (e.g., a memory area including NAND flash memory cells operated as multi-level memory cells (MLC)) may be assigned a second channel group, and may therefore exhibit a second data processing speed slower than the first data processing speed and a second data transmission speed slower than the first data transmission speed.

In this regard, the memory device 30 may dynamically allocate channel groupings (e.g., reallocate channels among channel grouping) and/or reassign channel groups among the memory areas according to the volume and/or characteristics of received sensing data. One characteristic that may be considered in this regard is the weight (e.g., an importance weighting factor) assigned the controller 20 to sensing data. The dynamic channel allocation capabilities of the memory device 30 provide more efficient use of memory device resources and faster overall data processing and data transmission.

Figure 2:
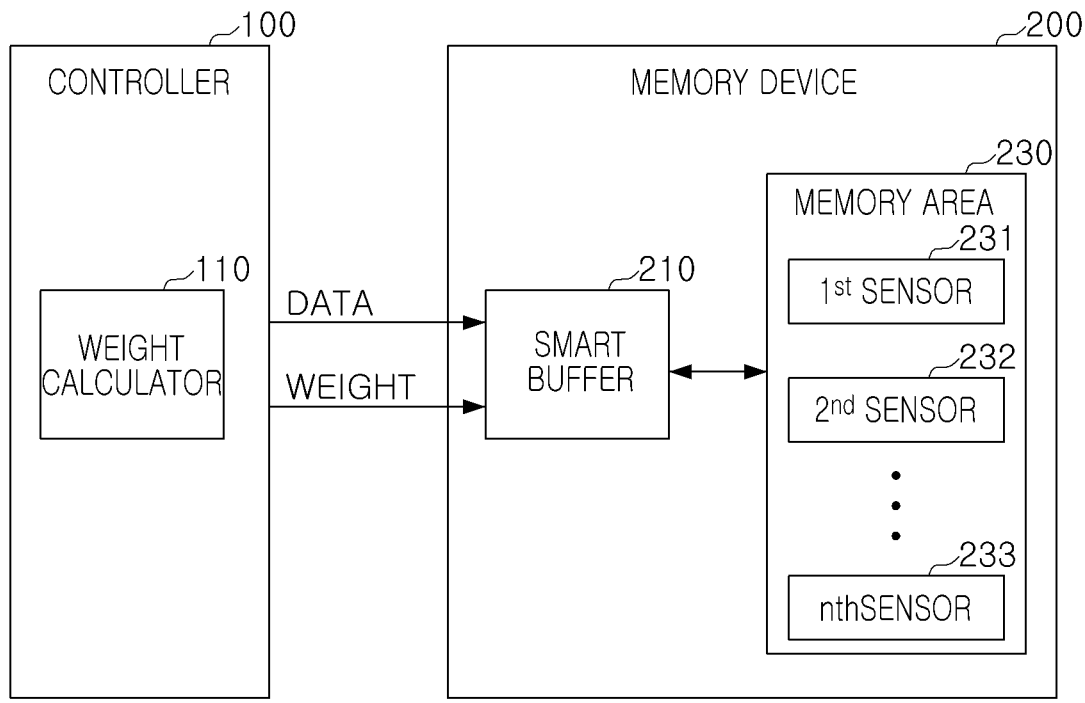
Figure 3:
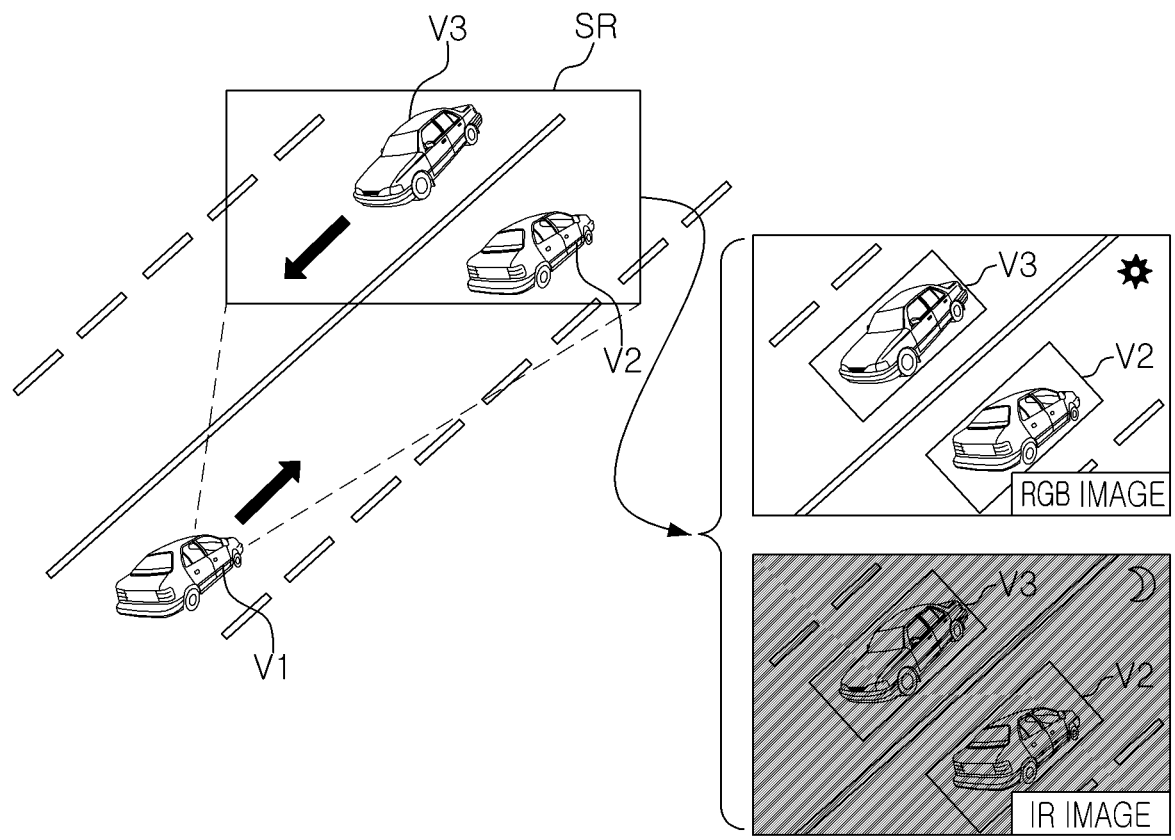

Hereinafter, a memory system (e.g., a controller and a memory device) that may be used in the computing system 1 of FIG. 1 will be described with reference to FIGS. 2, 3 and 4, where FIG. 2 is a block diagram, FIG. 3 is a conceptual use illustration and FIG. 4 is a conceptual table listing of data.

Referring to FIG. 2, a memory system 2 according to an embodiment of the inventive concept may include a controller 100 and a memory device 200. The controller 100 may include a weight calculator 110.

The weight calculator 110 may be used to assign a weight to data (e.g., sensing data) received from an external source (e.g., the sensor unit 10). Here, each "weight" may be a value indicating a corresponding importance of the sensing data to the memory system 2 and/or the computing system 1. The weight assigned to particular sensing data may vary with a volume of data, an operating environment of the memory system 2, etc. For example, when the memory system 2 is part of a vehicle-based computing system, the nature and volume of sensing data provided by the sensors may vary with the operating conditions of the vehicle, such as driving speed, driving time (e.g., day and night), driving direction (e.g., forward or backward driving), etc. Accordingly, the respective weight(s) assigned to various sensing data may also vary with operating conditions of the vehicle.

Alternately or additionally, when the memory system 2 is an IoT system, the particular weighting of various sensing data may vary with many factors, such as a user's living pattern (e.g., bedtime), domicile layout or structure (e.g., south facing windows), etc. Specific examples in which the memory system 2 is a vehicle-based system will be described in some additional detail with reference to FIGS. 3 and 4.

Referring to FIG. 3, the memory system 2 and corresponding sensors may be mounted in a first vehicle V1. The sensors may include two image sensors (e.g., an RGB sensor and an infrared ray (IR) sensor), a speed sensor (e.g., an acceleration sensor), a distance sensor (e.g., a lidar or an ultrasonic sensor), etc.

The sensors may collect various sensing data while the first vehicle V1 is being operated. For example, assuming that the first vehicle V1 is driven in a forward direction, the two image sensors disposed in the first vehicle V1 may be used to detect an obstacle appearing in a predetermined sensing area SR. Thus, one or more of the image sensors disposed in the first vehicle V1 may detect a second vehicle V2 driving in the same traffic lane as the first vehicle, as well as a third vehicle V3 driving in an opposite traffic within the sensing area SR.

When the first vehicle V1 is driving during the day, the RGB sensor may most effectively be used to detect the second vehicle V2 and the third vehicle V3. In contrast, when the first vehicle V1 is driving during the night, the IR sensor may most effectively be used to detect the second vehicle V2 and the third vehicle V3. Therefore, in order to most accurately and effectively detect the presence of the second vehicle V2 and the third vehicle V3 in the sensing area SR under different operating conditions, a first weighting of first sensing data provided by the RGB sensor data and a second weighting of second sensing data provided by the IR sensor may vary with the different operating conditions. Thus, during the daytime the first sensing data may be more heavily weighted over the second sensing data to indicate its higher daytime driving utility, while during the nighttime the second sensing data may be more heavily weighted over the first sensing data to indicate its higher nighttime driving utility.

When the first vehicle V1 is driven in the forward direction, sensing data collected by the speed sensor may be more important than sensing data collected by the distance sensor (e.g., to maintain a constant driving speed during a cruise control functionality). However, when the first vehicle V1 is driven in a backward direction (e.g., during parking), sensing data collected by a rear-facing image sensor (e.g., a distance sensor) may be more important than sensing data collected by the speed sensor in order to prevent collision with an rearward obstacle.

Accordingly, the weight calculator 110 may variously assign weight(s) to various sensing data depending on a state of the vehicle and/or a range of operating conditions. In an embodiment, the weight calculation unit 110 may include a neural network circuit implemented with a convolutional neural network (CNN) model, a recurrent neural network (RNN) model, a generative adversarial network (GAN) model, or the like.

In certain embodiments, the weight calculator 110 may be used to "map" sensing data using assigned weights in order to effectively store and manage the weighted sensing data using one or more mapping table(s). An example of a mapping table that may be used in certain embodiments is illustrated in FIG. 4.

Referring to the mapping table of FIG. 4, various weights are assigned to different sensing data provided by different sensors (e.g., RGB sensor, IR sensor, acceleration sensor, lidar and ultrasonic sensor) and different sensor types (e.g., image sensors, speed sensors, distance sensors) in relation to vehicle operating conditions (e.g., daytime/nighttime and forward/backward driving).

Referring now to FIG. 2, the memory device 200 may include a smart buffer 210 and a memory area 230.

The smart buffer 210 may function as an interface between the controller 100 and the memory area 230. For example, the smart buffer 210 may store (write or program) data received from the controller 100 in the memory area 230 using an input channel. In addition, the smart buffer 210 may retrieve (or read) data from the memory area 230 and transfer the read data to the controller 100 using an output channel.

In this regard, the smart buffer 210 may receive sensing data (DATA) and corresponding (or mapped) weight(s) (WEIGHT) from the controller 100 and allocate one or more channel(s) to various data access operations based on the received sensing data and mapped weight(s).

In certain embodiments, the smart buffer 210 may group channels (e.g., one or more channels selected from among a number of available channels) in order to logically divide a plurality of memory areas (e.g., a first memory area 231, a second memory area 232 and an nth memory area 233) from a general memory area 230. Here, a first channel group may be designated and assigned to the first memory area 231, a second channel group may be designated and assigned to the second memory area 232, and so on, until a nth channel group is designated and assigned to the nth memory area 233. In the illustrated example of FIG. 2, separate channel groups are respectively assigned to corresponding memory areas, but other embodiments of the inventive concept may assign one channel group to access more than one memory area, or more than one channel group may be assigned to access a single memory area.

In certain embodiments, respective data processing speeds and/or data transmission speeds associated with the memory areas 231-233 divided from the memory area 230 of the memory device 200 may vary according to the number and/or nature of the assigned channel group(s). For example, when a number of channels grouped into the first channel group is different from a number of channels grouped into the second channel group, the data processing speed and/or the data transmission speed of the first channel group may be different from the data processing speed and/or data transmission speed of the second channel group.

For example, the data processing speed and/or data transmission speed of a particular memory area (e.g., 231-233) may vary according to the nature of the constituent memory cells of the memory area. Thus, the first memory area 231 may include NAND flash memory cells operated as SLC and assigned the first channel group, and the second memory area 232 may include NAND flash memory cells operated as MLC (e.g., triple-level memory cells (TLC) or quadruple-level cell (QLC)) and assigned the second channel group. Accordingly, a first data processing speed and a first data transmission speed for data of the first memory area 231 accessed by the first channel group may be respectively faster than a second data processing speed and a second data transmission speed for data of the second memory area 232 accessed by the second channel group. Thus, the first memory area 231 may be designated as a high-speed memory area, and the second memory area 232 may be designated as a low-speed memory area.

Here, it should be noted that a phase-change random-access memory (PRAM), a resistive random-access memory (RRAM), and/or a dynamic random-access memory (DRAM) might alternately or additionally be provided in the first memory area (and/or the second memory area 232) along with (or instead of) the SLC NAND flash memory (or the MLC NAND flash memory cells).

With these exemplary configurations in mind, the smart buffer 210 may transfer sensing data received from the controller 100 to the memory area 230, and selectively store the sensing data (once weighted) in at least one high-speed memory area (e.g., 231) and/or at least one low-speed memory area (e.g., 232), depending on the importance weight(s) assigned to the sensing data. Alternately or additionally, the smart buffer 210 may dynamically group and allocate channels, depending on the characteristics of the data, such as the size of the data, importance of the data, etc. In this manner, sensing data may be efficiently processed and transmitted, and memory device resources may be efficiently managed.

The respective sizes of the memory areas (e.g., 231-233) may vary (or be the same) and may be dynamically varied using the controller 20 and/or the smart buffer 210. For example, the first memory area 231 may include memory cells storing N-bit data and the second memory area 232 may include memory cells storing M-bit data, where 'N' and 'M' are positive integers (i.e., natural numbers) and N is less than M. In certain embodiments, successively designated memory areas (e.g., the nth memory area 233) may include memory cells storing (M+1)-bit data, (M+2)-bit data, etc.

Figure 5:
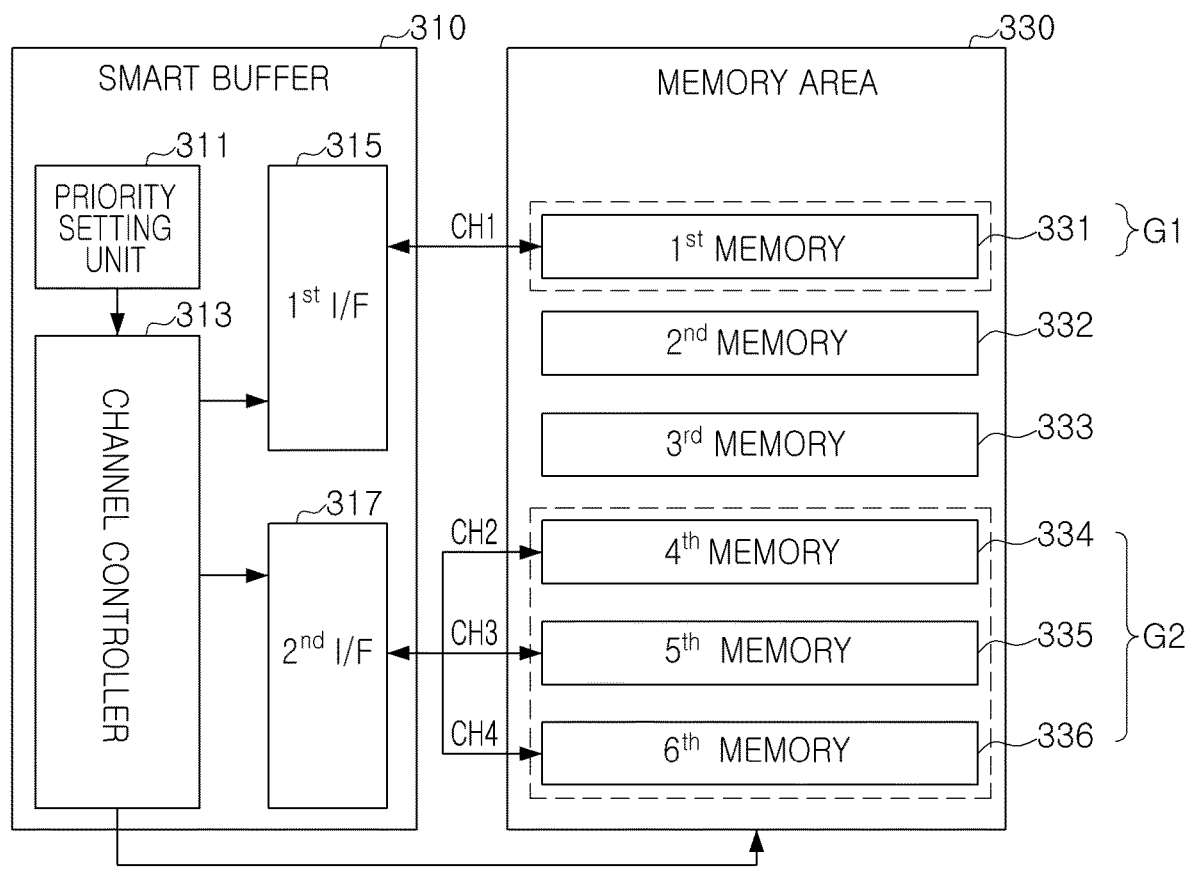
FIG. 5 is a view illustrating a memory device according to an embodiment of the inventive concept.
Figure 6A:
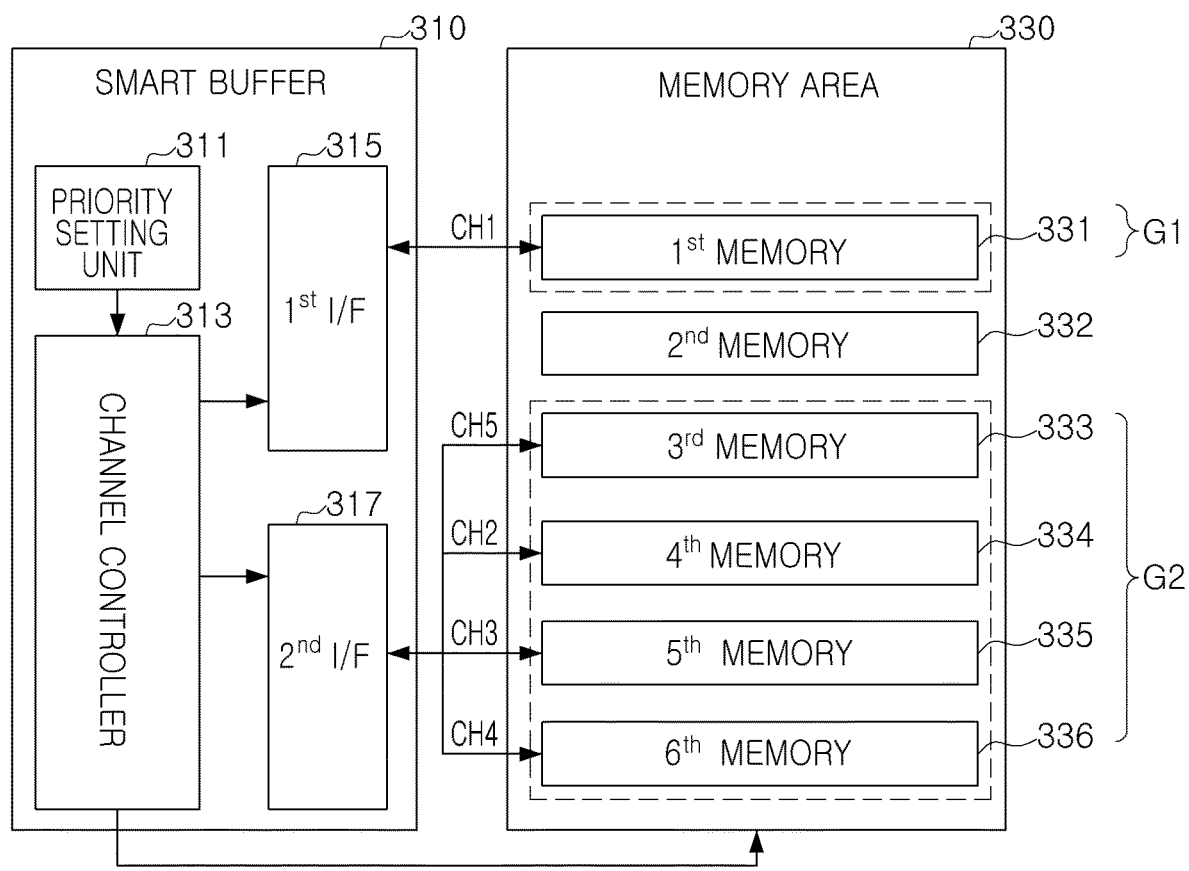
FIGS. 6A and 6B are views illustrating a method of generating a channel group by a memory device according to an embodiment of the inventive concept.
Figure 6B:
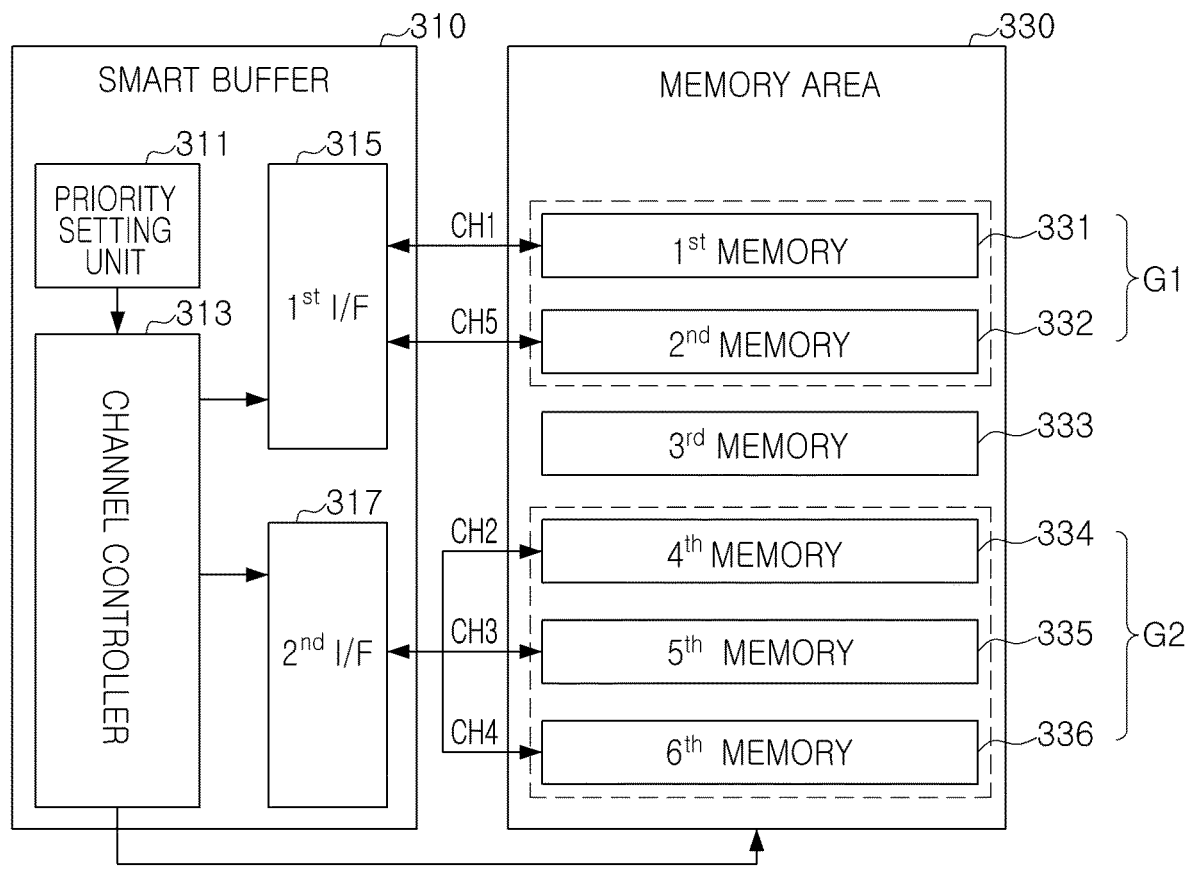

FIGS. 5, 6A and 6B are respective block diagrams illustrating comparative examples of a memory device according to an embodiment of the inventive concept.

Referring to FIG. 5, a memory device 300 includes a smart buffer 310 and a memory area 330, where the smart buffer 310 includes a priority setting unit 311, a channel controller 313, and a plurality of interfaces 315 and 317.

The priority setting unit 311 may be used to assign (or set) a priority for sensing data based on a previously assigned weight of the sensing data as determined by a controller. For example, the priority setting unit 311 may compare the weight of sensing data with one or more priority threshold value(s), and classify the sensing data as first priority sensing data, second priority sensing data, etc. based the comparison(s). Here, the one or more priority threshold values may be determined in relation to sensing data volume, sensing data size, a number of active sensors, etc. in view of memory system capacities (e.g., the size of memory area 330) and capabilities.

The channel controller 313 may be used to group and assign channel(s) from among a plurality of channels CH1 to CH4 to a plurality of memory areas 331 to 336 (e.g.,) based on the size of the sensing data in the illustrated example of FIG. 5. When the size of sensing data classified as the first priority sensing data is less than 1 gigabyte (GB), the channel controller 313 may allocate a first channel CH1 to a first memory 331. In addition, when the size of sensing data classified as the second priority sensing data is at least 3 gigabytes (GB) but less than 4 gigabytes (GB), the channel controller 313 may respectively assigned second, third and fourth channels CH2, CH3 and CH4 to fourth, fifth and sixth memories 334 to 336. In this example configuration, the first channel CH1 may be understood as a first channel group, and the second, third and fourth channels CH2, CH3 and CH4 may be understood as a second channel group.

The first, fourth, fifth and sixth memory areas 331, 334, 335 and 336 assigned the foregoing channels CH1 to CH4 may be implemented using respective, different memory chips, portions of a single memory chip, or portion(s) of multiple memory chips. The respective memory areas 331-336 may be divided according to different address ranges, different physical locations, different memory chips, etc.

Consistent with the example illustrated in FIG. 5, the channel controller 313 may allocate (or group) and assign the channels CH1 to CH4 based on one or more priorities set by the priority setting unit 311. For example, the channel controller 313 may allocate and assign the first channel CH1 to the first memory area 331 through the first interface 315 in order to process first priority sensing data using a first channel group G1. The channel controller 313 may also allocate and respectively assign the second, third and fourth channels CH2, CH3 and CH4 to the fourth, fifth and sixth memory areas 334, 335 and 336 through the second interface 317 in order to process second priority sensing data using a second channel group G2.

The foregoing embodiment is an example of how a number of channels may be dynamically allocated, and a number of channel groups may be dynamically assigned by the channel controller 313 depending on one or more sensing data characteristics (e.g., volume, size and/or weight).

Referring to FIG. 6A, when the volume of second priority sensing data among sensing data received from a controller increases over the example described in relation to FIG. 5, for example, the channel controller 313 may further allocate a fifth channel CH5 to the second channel group G2 and assigned the fifth channel CH5 to a third memory 333. In other words, the second channel group G2 may be dynamically expanded to access an additional memory area (e.g., third memory 333) in order to accommodate an increased volume of second priority sensing data.

Referring to FIG. 6B, when the volume of first priority sensing data among sensing data received from a controller increases over the example described in relation to FIG. 5, for example, the channel controller 313 may further allocate a fifth channel CH5 to the first channel group G1 and assigned the fifth channel CH5 to a second memory 332. In other words, the first channel group G1 may be dynamically expanded to access an additional memory area (e.g., second memory 332) in order to accommodate an increased volume of first priority sensing data.

Of course the comparative examples presented with respect to FIGS. 5, 6A and 6B are merely illustrative examples. A number of sensing data classifications, a number of sensing data priorities, a number of sensing data thresholds, a number of smart buffer interfaces, a number of memory areas, a number of channels, and a number of channel groups may vary with design. Further, channel allocations, channel group assignments, and interface (e.g., interfaces 315 and 317) interconnections may dynamically vary according to need(s) and memory system resources.

However, one or more channel controller(s), like channel controller 313, may be used to control the overall exchange of data across the plurality of memories (e.g., 331-336) using one of more interfaces (e.g., 315 and 317). Here, each of the interfaces 315 and 317 may include at least one switching element. In addition, each of the interfaces 315 and 317 may satisfy at least one of various interface protocols, such as a universal serial bus (USB), a small computer system interface (SCSI), a peripheral component interconnect express (PCIe), a mobile PCIe (M-PCIe), an advanced technology attachment (ATA), a parallel ATA (PATA), a serial ATA (SATA), a serial attached SCSI (SAS), an integrated drive electronics (IDE), a universal flash storage (UFS), and the like.

The memory area 330 of FIGS. 5, 6A and 6B include the plurality of memories 331 to 336, and channels CH1 to CH4 allocated and assigned among the plurality of memories 331 to 336. In certain embodiments, the plurality of memories 331 to 336 may include one or more reserve areas designated to store one or more types of sensing data (e.g., sensing data having a particular priority and/or classification). For example, the plurality of memories 331 to 336 may include a first reserve area designated to store only first priority sensing data, and a second reserve area designated to store nth sensing data having a lower, nth priority. Here, the first reserve area may include high-speed memory cells such as SLC NAND flash memory cells, PRAM cells, RRAM cells, and/or DRAM cells, whereas the nth reserve area may include low-speed memory cells, such as MLC NAND flash memory cells.

Figure 7:
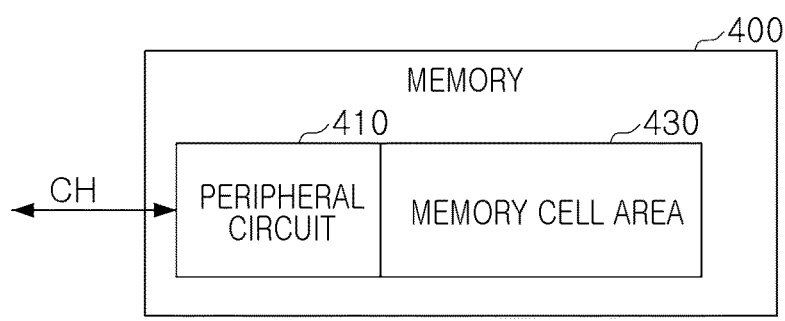
FIG. 7 is a view illustrating a configuration of a memory according to an embodiment of the inventive concept.

FIG. 7 is a block diagram illustrating one possible configuration for a memory device 400 according to embodiments of the inventive concept.

Referring to FIG. 7, the memory device 400 includes a peripheral circuit 410 and a memory cell area 430.

The peripheral circuit 410 may include various circuit elements, depending on a type of memory cell included in the memory cell area 430. For example, when the memory cell area 430 includes a dynamic random-access memory (DRAM), the peripheral circuit 410 may include a command/address buffer, a command decoder, a data buffer, a data input/output pin, a row decoder, a column decoder, and the like.

The command/address buffer may store various commands and address signals, received from a controller. The commands may include a write command, a read command, a precharge command, a refresh command, and the like. In addition, the address signals may include a bank address, a row address, a column address, and the like.

The command decoder may receive a command from the command/address buffer, and may decode the received command. The command decoder may control the row decoder and the column decoder, according to the decoded command. For example, the command decoder may control the row decoder, according to the precharge command or the refresh command. In addition, the command decoder may control the column decoder, according to the write command or the read command.

The data buffer may receive write data through the data input/output pin, and may output data stored in the memory cell area 430 through the data input/output pin. In other words, the memory 400 may receive or output data through the data input/output pin connected to a channel CH.

The number of data input/output pins connected to each channel groups may vary, depending on a size of memory included in each of the channel groups. For example, the number of data input/output pins connected to a first channel group including a high-speed low capacity memory may be greater than the number of data input/output pins connected to a second channel group including a low-speed high capacity memory.

The row decoder may select a word line, based on a row control signal received from the command decoder and a row address received from the command/address buffer.

The column decoder may select a column line, based on a column control signal received from the command decoder and a column address received from the command/address buffer.

The memory 400 may store data in the memory cell area 430 corresponding to the selected word line and the selected column line, or read data from the memory cell area 430.

The memory cell area 430 may include a plurality of memory cells. According to an embodiment, different channel groups may be allocated to the memory 400, depending on a type of the memory cells included in the memory cell area 430. For example, when the memory cell area 430 includes a plurality of MTJ elements, PRAM elements, and/or RRAM elements, a first channel group for storing first priority sensing data may be allocated to the memory 400. In addition, when the memory cell area 430 includes an MLC NAND flash memory, a second channel group for storing second priority sensing data may be allocated to the memory 400.

Figure 8:
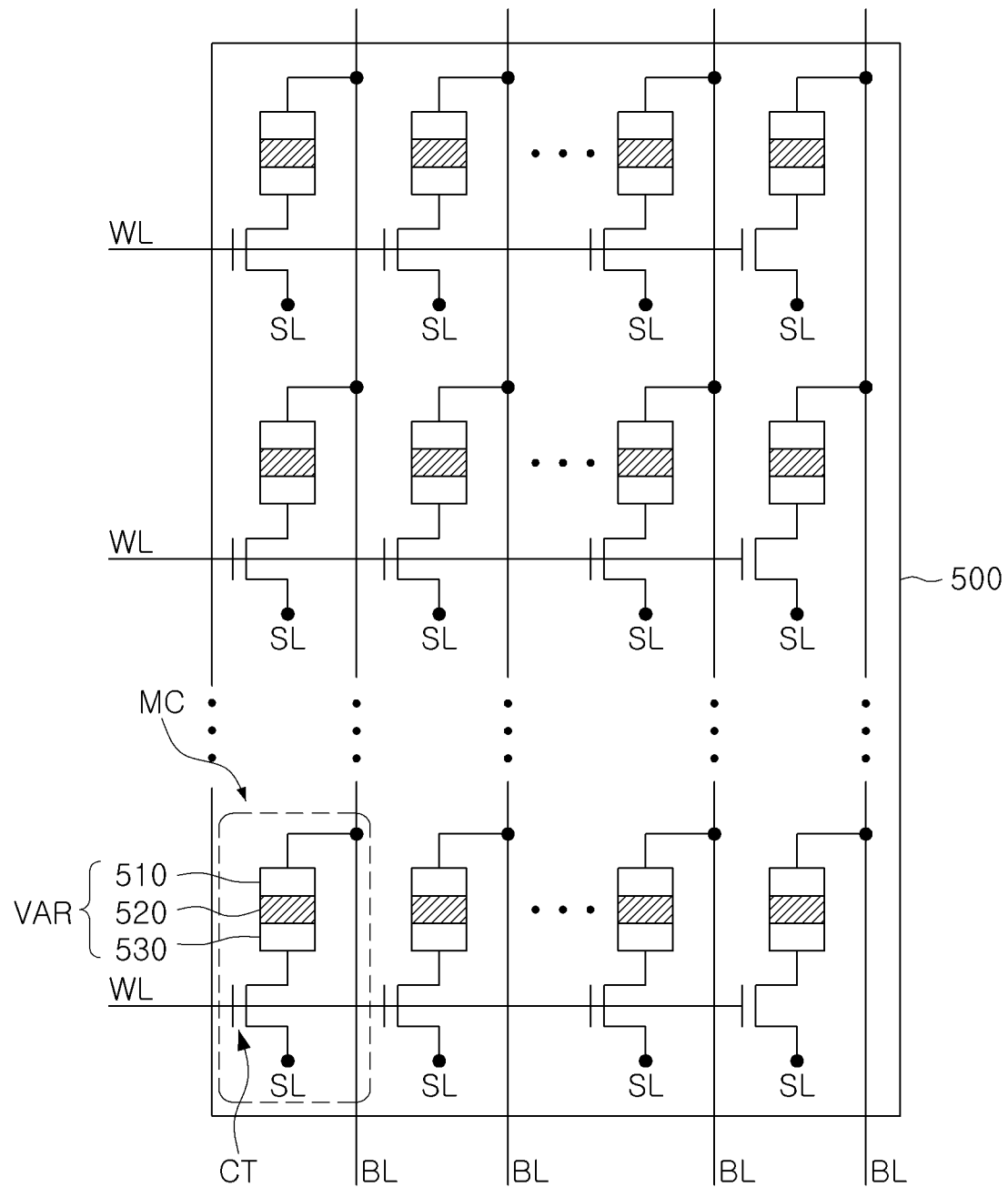
FIGS. 8, 9A, and 9B are views illustrating a structure of a memory cell that may be included in a memory according to an embodiment of the inventive concept.
Figure 9A:
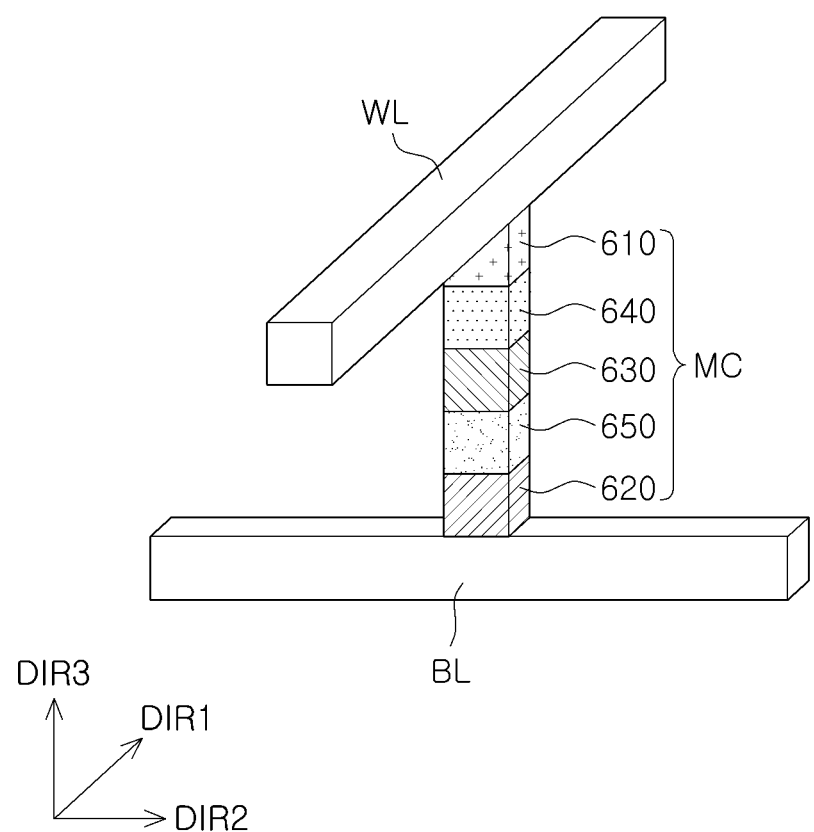
Figure 9B:
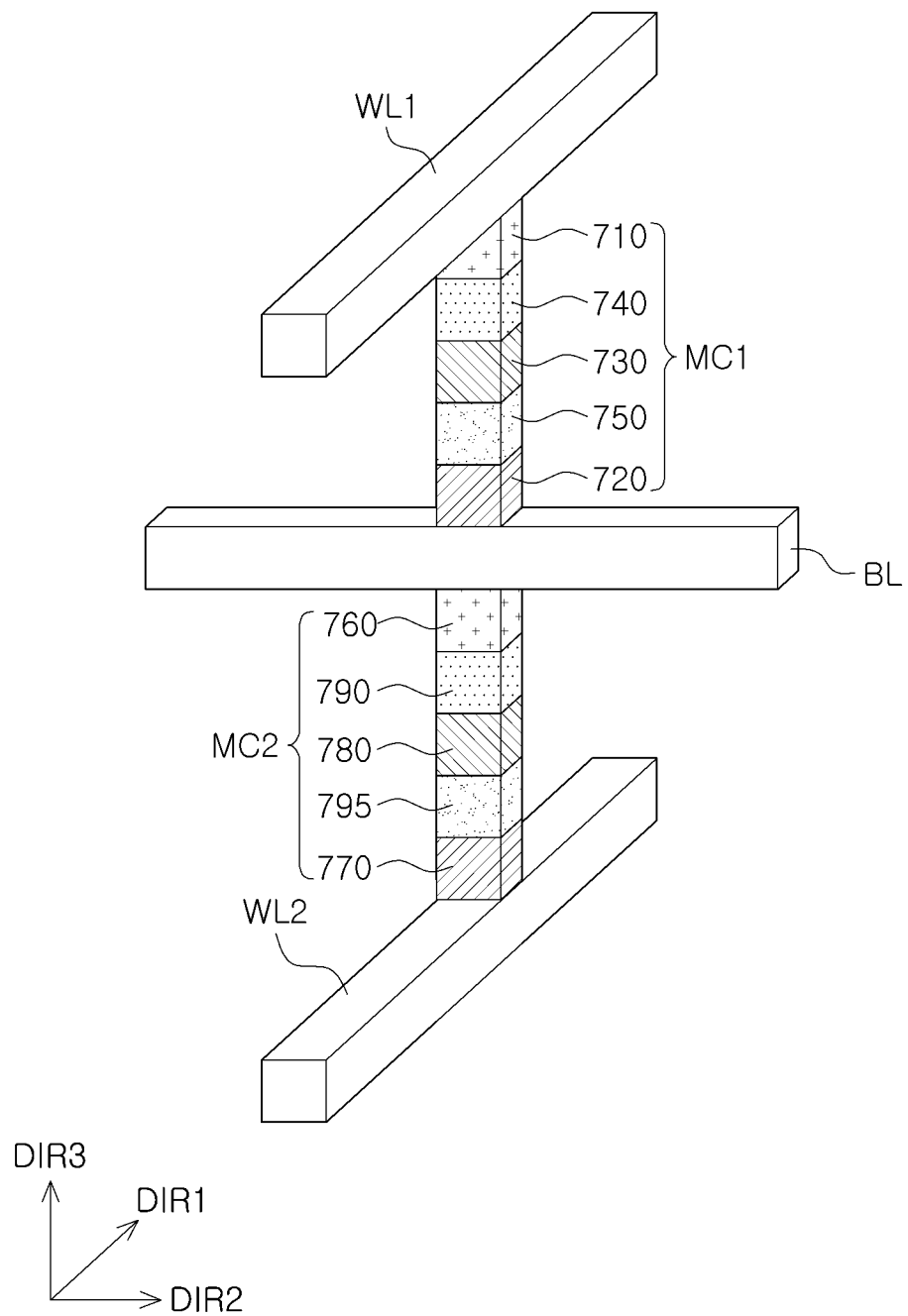

FIGS. 8, 9A, and 9B are diagram illustrating in certain examples structure(s) for a memory cell that may be included in a memory device according to embodiments of the inventive concept.

Referring to FIG. 8, a memory cell area 500 may include a plurality of memory cells MC disposed in areas in which a plurality of word lines WL0 to WLN and a plurality of bit lines BL0 to BLM intersect. Each of the memory cells MC may include a variable resistor VAR and a cell transistor CT.

When the plurality of memory cells MC are MTJ elements, the variable resistor VAR may include a pinned layer 510, a barrier layer 520, and a free layer 530.

A magnetization direction of the pinned layer 510 may be fixed, and a magnetization direction of the free layer 530 may be parallel to the magnetization direction of the pinned layer 510 according to data stored in each of the memory cells MC or may be anti-parallel thereto. For example, when the data stored in each of the memory cells MC is '0', the magnetization direction of the free layer 530 may be the same as the magnetization direction of the pinned layer 510. When the data stored in each of the memory cells MC is '1', the magnetization direction of the free layer 530 may be opposite to the magnetization direction of the pinned layer 510. A resistance value of each of the memory cells MC may vary, depending on the magnetization direction of the free layer 530.

Each of the memory cells MC may further include an anti-ferromagnetic layer to fix the magnetization direction of the pinned layer 510.

A gate of the cell transistor CT may be connected to the word lines WL0 to WLN. In addition, one electrode, for example, a drain of the cell transistor CT may be connected to the bit lines BL0 to BLM through each of the memory cells MC, and the other electrode, for example, a source of the cell transistor CT may be connected to source lines SL. The source lines SL connected to the cell transistor CT may be different for each of the memory cells MC. In addition, the source lines SL connected to the cell transistor CT may be also common in one or more memory cells MC.

In FIG. 8, when the variable resistors VAR of the plurality of memory cells MC are replaced with a phase-change material such as Ge—Sb—Te (GST) or the like, the plurality of memory cells MC may be phase-change random-access memory (PRAM) elements. In addition, when the variable resistors VAR of the plurality of memory cells MC are replaced with a resistive material such as a transition metal oxide or the like, the plurality of memory cells MC may be resistive random-access memory (RRAM) elements.

Alternate structure(s) for a memory cell that may be included in a memory device according to an embodiment of the inventive concept are illustrated in FIGS. 9A and 9B.

Referring to FIG. 9A, a memory cell MC included in a memory cell area may be disposed between a word line WL extending in a first direction (DIR1), and a bit line BL extending in a second direction (DIR2), perpendicular to the first direction (DIR1).

The memory cell MC may include a first electrode 610 connected to the word line WL, a second electrode 620 connected to the bit line BL, and a third electrode 630 disposed between the first electrode 610 and the second electrode 620. In addition, the memory cell MC may include a storage element layer 640 disposed between the first electrode 610 and the third electrode 630, and a selective element layer 650 disposed between the third electrode 630 and the second electrode 620.

The storage element layer 640 may include a GST material in which germanium (Ge), antimony (Sb), and tellurium (Te) are combined. The storage element layer 640 may store data, according to a difference in threshold value voltage or resistance. For example, the storage element layer 640 may have a low resistance and a low threshold value voltage in a crystalline state, may have a high resistance and a high threshold value voltage in an amorphous state, and may use such characteristics to store data.

The selective element layer 650 may be an element for selecting a memory cell MC, and may include a chalcogenide-based material in which germanium (Ge), selenium (Se), and tellurium (Te) are combined.

Referring to FIG. 9B, a memory cell area may include a first memory cell MC1 disposed between a first word line WL1 extending in a first direction (DIR1) and a bit line BL extending in a second direction (DIR2), perpendicular to the first direction (DIR1). In addition, the memory cell area may include a second memory cell MC2 disposed between a bit line BL and a second word line WL2 extending in a third direction (DIR3), perpendicular to both the first and second directions (DIR1 and DIR2), and spaced apart from the first word line WL1.

Each of the first and second memory cells MC1 and MC2 may have the same structure as the memory cell MC described above with reference to FIG. 9A. For example, the first memory cell MC1 may include first to third electrodes 710 to 730, a storage element layer 740 disposed between the first electrode 710 and the third electrode 730, and a selective element layer 750 disposed between the third electrode 730 and the second electrode 720. In addition, the second memory cell MC2 may include first to third electrodes 760 to 780, a storage element layer 790 disposed between the first electrode 760 and the third electrode 780, and a selective element layer 795 disposed between the third electrode 780 and the second electrode 770. The storage element layer 740 of the first memory cell MC1 and the storage element layer 790 of the second memory cell MC2 may include a GST material. In addition, the selective element layer 750 of the first memory cell MC1 and the selective element layer 795 of the second memory cell MC2 may include a chalcogenide-based material.

Figure 10A:
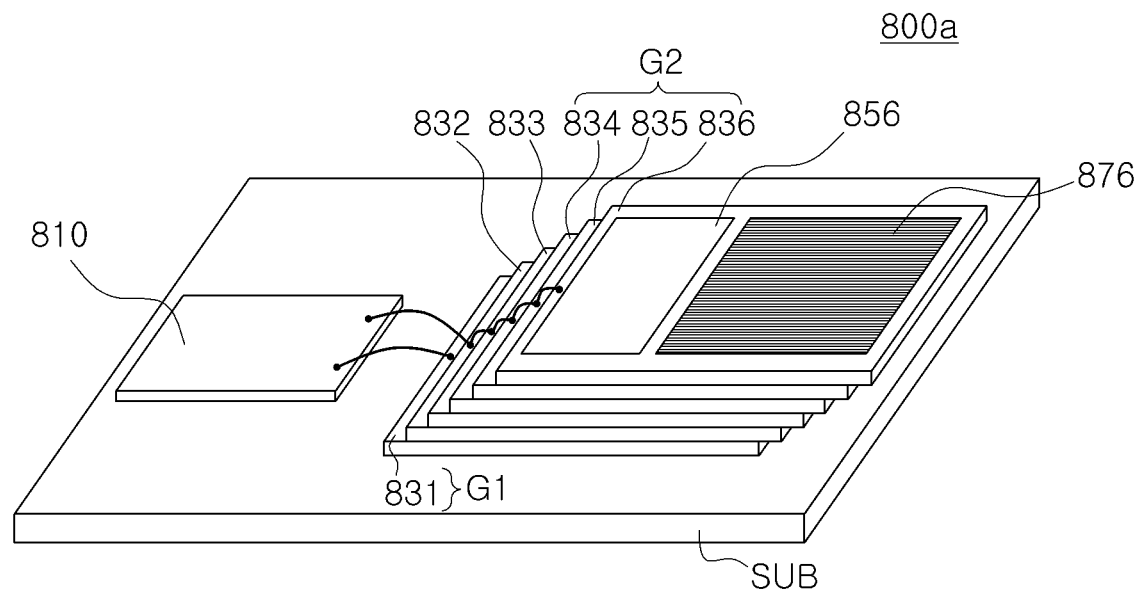
FIGS. 10A and 10B are schematic views illustrating a structure of a memory device according to an embodiment of the inventive concept.
Figure 10B:
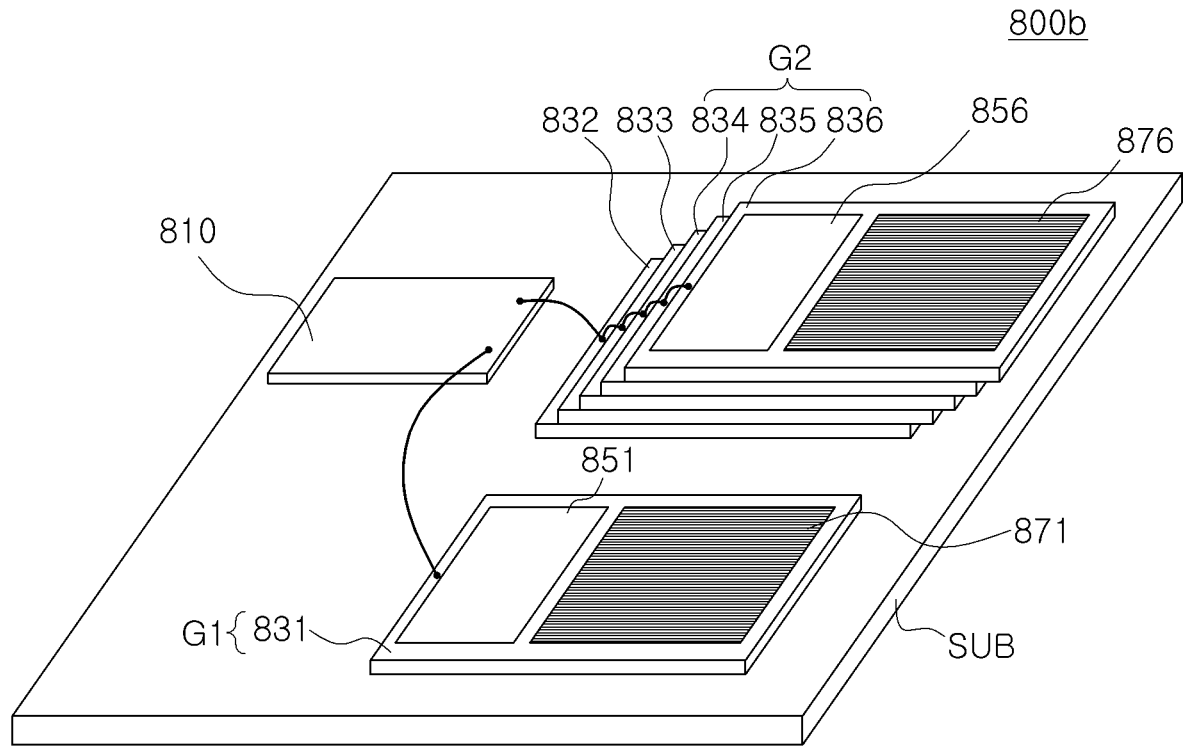

FIGS. 10A and 10B are perspective views respectively illustrating possible layouts for a memory device according to embodiments of the inventive concept.

Referring to FIG. 10A, a memory device 800a may be implemented as a memory package. The memory device 800a may include a package substrate SUB, and a smart buffer 810 and a plurality of memories 831 to 836, mounted on the package substrate SUB.

The package substrate SUB may provide an input/output path between a controller and the memory device 800a. The package substrate SUB may include a printed circuit board, a flexible circuit board, a ceramic board, or an interposer. When the package substrate SUB may be an interposer, the package substrate SUB may be implemented by using a silicon wafer.

A plurality of wirings may be formed in the package substrate SUB. The plurality of wirings may provide a data path for a plurality of channels.

The plurality of memories 831 to 836 may be formed on different memory dies, and may be vertically stacked on the package substrate SUB. As illustrated in FIG. 10A, each of the memories 831 to 836 may be included in different memory chips, but is only illustrative. Embodiments of the inventive concept are not limited thereto. For example, the first and second memories 831 and 832 may be included in a single memory chip. In other words, after dividing a plurality of memory cells included in a single memory chip into first and second areas having different address ranges, the first and second areas may be set as the first and second memories 831 and 832. In this case, the first and second memories 831 and 832 may be included in the same memory die to be arranged on the same level on the package substrate SUB.

Each of the memories 831 to 836 may include a peripheral circuit 856 and a memory cell area 876. The memory cell area 876 may include a plurality of memory cells, and the peripheral circuit 856 may store sensing data input from the smart buffer 810 in the plurality of memory cells, or may output sensing data read from the plurality of memory cells to the smart buffer 810.

Channels may be allocated in groups and assigned one or more of the plurality of memories 831 to 836 according to the priority of sensing data to be stored in the memory device 800a. That is, the channel groups assigned to the plurality of memories 831 to 836 may include at least one channel according to the priority of data. For example, sensing data to be stored in the memory device 800a may be classified into first priority sensing data and second priority sensing data, according to a weight calculated by the controller. The smart buffer 810 may allocate a first channel group G1 to the first memory 831, to store the first priority data, and may allocate a second channel group G2 to the fourth to sixth memories 834 to 836 to store the second priority data.

The memories 831 and 834 to 836 included in each of the channel groups G1 and G2 may be connected to the smart buffer 810 by a wire. For example, the first memory 831 included in the first channel group G1 may be connected to the smart buffer 810 by a first wire. In addition, the fourth to sixth memories 834 to 846 included in the second channel group G2 may be connected to the smart buffer 810 by a second wire. As the number of memories connected to a wire increases, the resulting data processing load increases. Hence the data processing speed and data transmission speed should also increase. For example, time required to store and read data in the fourth to sixth memories 834 to 836 connected to the second wire may be longer than time required to store and read data in the first memory 831 connected to the first wire. Such results may increase as the number of memories included in each of the channel groups increases. Therefore, the smart buffer 810 according to an embodiment of the inventive concept may compactly set a size for a channel group assigned to memory area(s) storing sensing data having a relatively high importance (or weight), and may sparsely set a size for a channel group assigned to memory area(s) storing sensing data having a relatively low importance in order to provide balancing difference(s) in data transmission speed and thus process the overall data more efficiently.

The plurality of memories 831 to 836 may be distributed on the package substrate SUB. For example, referring to FIG. 10B, a first memory 831 may be disposed separately from second to sixth memories 832 to 836 on a package substrate SUB. Similarly, the second to sixth memories 832 to 836 may also be separately disposed on the package substrate SUB.

Figure 11A:
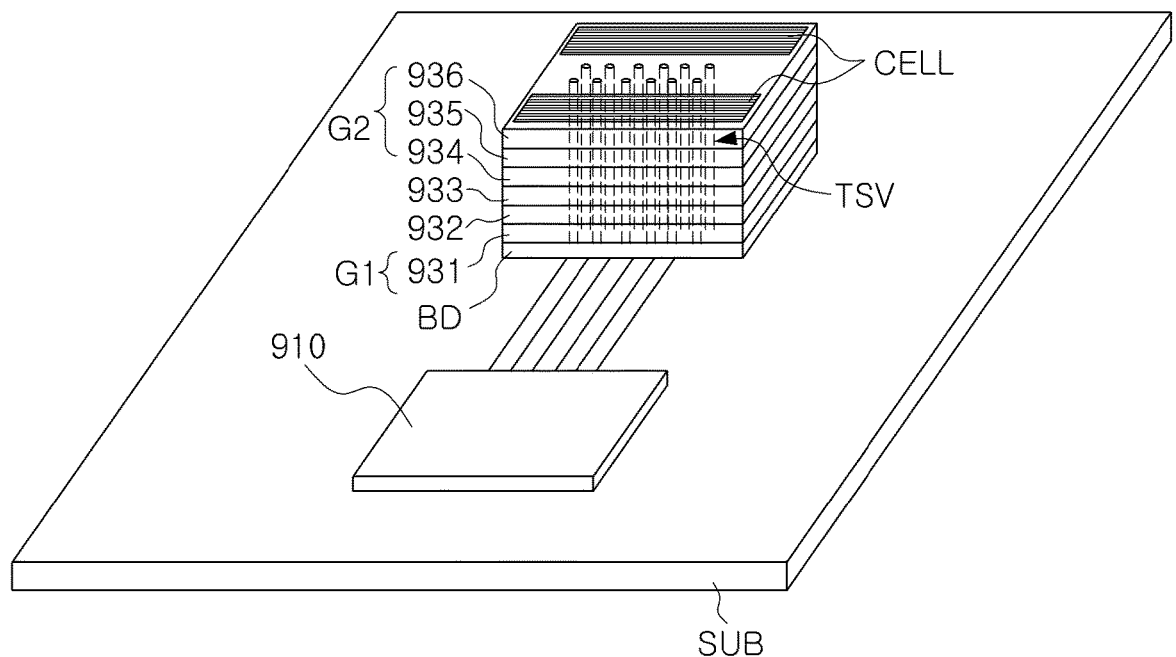
FIGS. 11A and 11B are schematic views illustrating a structure of a memory device according to an embodiment of the inventive concept.
Figure 11B:
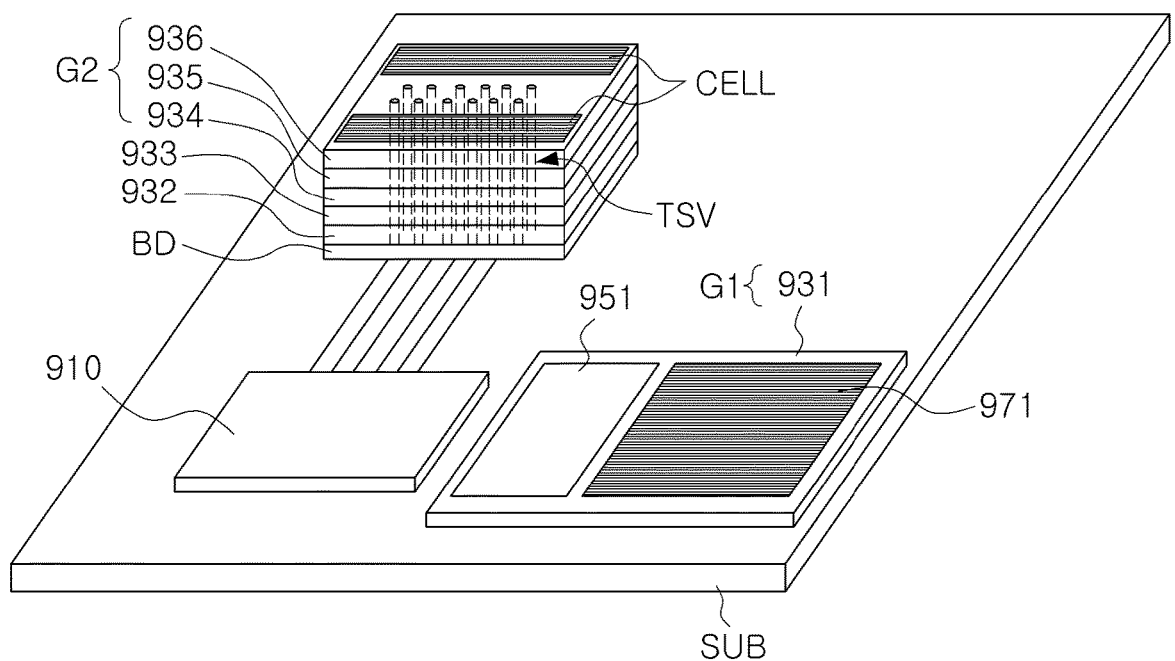

FIGS. 11A and 11B are perspective diagram illustrating possible structure(s) for a memory device according to embodiments of the inventive concept.

Referring to FIG. 11A, a memory device 900a may be implemented as a memory package. The memory device 900a may include a package substrate SUB, and a smart buffer 910 and a plurality of memories 931 to 936, mounted on the package substrate SUB.

The package substrate SUB may provide an input/output path between a controller and the memory device 900a. In addition, wirings for a plurality of channels may be formed in the package substrate SUB.

The smart buffer 910 may allocate at least one channel to the plurality of memories 931 to 936, and may provide an interface function for controlling a data input/output.

The smart buffer 910 may set priority according to a weight of the sensing data collected from a plurality of sensors, and may allocate at least one channel to the plurality of memories 931 to 936 according to the priority, to control a data input/output operation. In an embodiment, the smart buffer 910 may designate sensing data having a weight higher than a first threshold value as first priority data, and may allocate a high-speed memory area for the first priority sensing data, to provide data processing at a higher speed. In addition, the smart buffer 910 may set sensing data having a weight lower than the first threshold value as second priority sensing data, and may provide a low-speed high capacity memory area for the second priority sensing data in order to control data processing albeit at a slower speed.

In an embodiment, the high-speed memory area and the low-speed high capacity memory area may be divided according to the number of channels allocated to each of the areas. For example, the number of channels allocated to the high-speed memory area may be less than the number of channels allocated to the low-speed high capacity memory area.

In an embodiment, the high-speed memory area and the low-speed high capacity memory area may be divided according to the types of memory cells included in each of the areas. For example, the high-speed memory area may include at least one of a phase-change random-access memory (PRAM), a resistive random-access memory (RRAM), a dynamic random-access memory (DRAM), and an SLC NAND flash memory. Also, the low-speed high capacity memory area may include at least one of an MLC NAND flash memory, a TLC NAND flash memory, and a QLC NAND flash memory.

In an embodiment, the high-speed memory area and the low-speed high capacity memory area may be divided according to the number of data input/output pins included in each of the areas. For example, the number of data input/output pins included in the high-speed memory area may be greater than the number of data input/output pins included in the low-speed high capacity memory area.

The smart buffer 910 may give priority to sensing data to be stored in the plurality of memories 931 to 936 according to its importance. For example, the smart buffer 910 may classify the sensing data to be stored in the plurality of memories 931 to 936 as either first priority sensing data or second priority sensing data. The smart buffer 910 may allocate a first channel group G1 to the first memory 931 to store the first priority sensing data, and allocate a second channel group G2 to the fourth to sixth memories 934 to 936 to store the second priority sensing data.

A buffer die BD may be disposed between the plurality of memories 931 to 936 and the package substrate SUB. Peripheral circuits for driving the plurality of memories 931 to 936 may be disposed in the buffer die BD.

The plurality of memories 931 to 936 may include a memory cell area CELL for storing data. Also, the plurality of memories 931 to 936 may include a plurality of through silicon vias TSV passing through a plurality of dies. The plurality of through silicon vias TSV may be disposed to correspond to a channel allocated to the plurality of memories 931 to 936. For example, when a total of four channels each having 64 bits are allocated to the plurality of memories 931 to 936, the plurality of through silicon vias TSV may include configurations for data input/output of 256 bits in total.

The plurality of memories 931 to 936 may be distributed on the package substrate SUB. For example, referring to FIG. 11B, a first memory 931 may be disposed separately from second to sixth memories 932 to 936 on a package substrate SUB. Similarly, the second to sixth memories 932 to 936 may also be divided and distributed in a predetermined number on the package substrate SUB.

Hereinafter, a method of operating a memory device according to an embodiment of the inventive concept will be described in some additional detail with reference to FIGS. 12, 13A and 13B.

Figure 12:
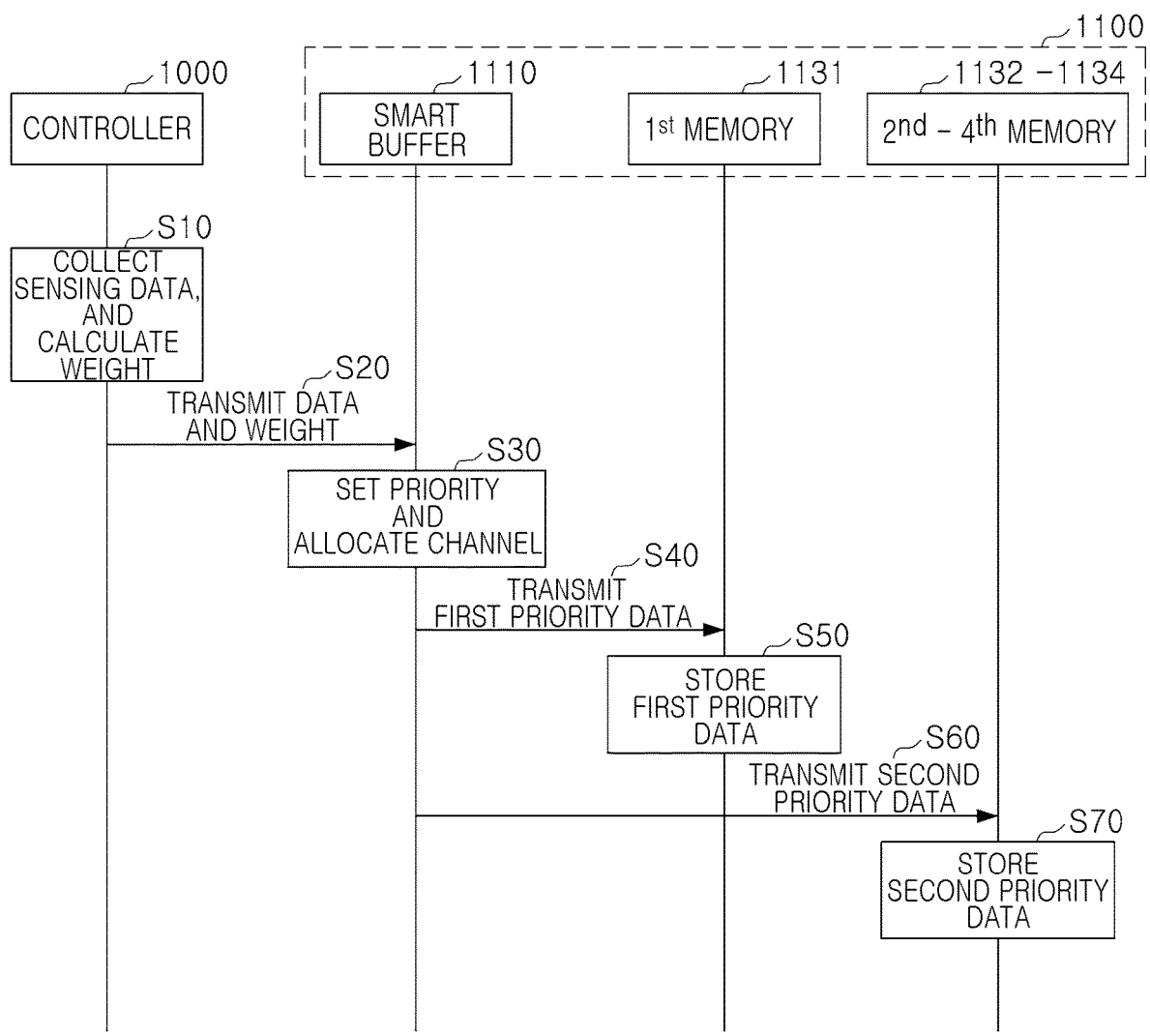
FIG. 12 is a flowchart illustrating a method of operating a memory device according to an embodiment of the inventive concept.

FIG. 12 is a flow diagram illustrating a method of operating a memory device according to embodiments of the inventive concept.

Referring to FIG. 12, a controller 1000 may receive sensing data collected by one or more sensors and calculate weight(s) for the received sensing data (S10). The weight may be a value indicating a relative importance of the sensing data, and may vary, depending on an operating environment of a system or host (e.g., a vehicle) incorporating the memory system. Here, the controller 1000 may execute a neural network circuit on the data collected from the plurality of sensors, to calculate a weight of the data. The neural network circuit may include a CNN model, a RNN model, a GaN model, and the like. In an embodiment, the controller 1000 may store and manage the sensing data and corresponding weight(s) using a mapping table.

The controller 1000 may then transfer the sensing data and corresponding weight(s) to a smart buffer 1110 of a memory device 1100 (S20).

The smart buffer 1110 may use the sensing data received from the controller 1000 and weight(s) to determine (or set) a priority for the sensing data (S30). For example, when the sensing data greater than a first threshold value, the smart buffer 1110 may determine that the sensing data is a relatively high priority sensing data, and may designate it as first priority sensing data. However, when the sensing data is less than or equal to the first threshold value, the smart buffer 1110 may determine that the sensing data is relatively lower priority sensing data, and may designate it as second priority sensing data.

The smart buffer 1110 may also allocate one or more channels among a plurality of channels into one or more channel groups and assign the channel groups among memories 1131 to 1134 in order to store the first priority sensing data and the second priority sensing data (S30). For example, the smart buffer 1110 may allocate a first channel of a first channel group to the first memory 1131 in order to process the first priority sensing data. The smart buffer 1110 may also allocate second, third and fourth channels to a second channel group and respectively assign these channels to the second, third and fourth memories 1132 to 1134 in order to process the second priority sensing data.

The smart buffer 1110 may transmit the first priority sensing data to the first memory 1131 using the first channel of the first channel group (S40). In this case, the smart buffer 1110 may transmit the first priority sensing data using a direct transmission method (e.g., instead of an existing time division transmission method, a channel interleaving method, or the like) in order to increase the data transmission speed. The first priority sensing data transferred from the smart buffer 1110 may be stored in memory cells of the first memory 1131 (S50). In certain embodiments, the memory cells of the first memory 1131 may include a next-generation memory elements such as an MTJ element, a PRAM element, a RRAM element, and the like. Alternately or additionally, the memory cells included in the first memory area 1131 may include a DRAM element, an SLC NAND flash memory element, and the like.

The smart buffer 1110 may respectively transmit the second priority sensing data to the second, third and fourth memories 1132 to 1134 through the second, third and fourth channels of the second channel group (S60). In this case, the smart buffer 1110 may transmit the second priority sensing data in parallel using a time division transmission method, a channel interleaving method, or the like. The second priority sensing data transferred from the smart buffer 1110 may be stored in memory cells included in the second, third and fourth memories 1132, 1133 and 1134 (S70). In certain embodiments, the memory cells included in the second, third and fourth memories 1132, 1133 and 1134 may include an MLC NAND flash memory element.

Figure 13A:
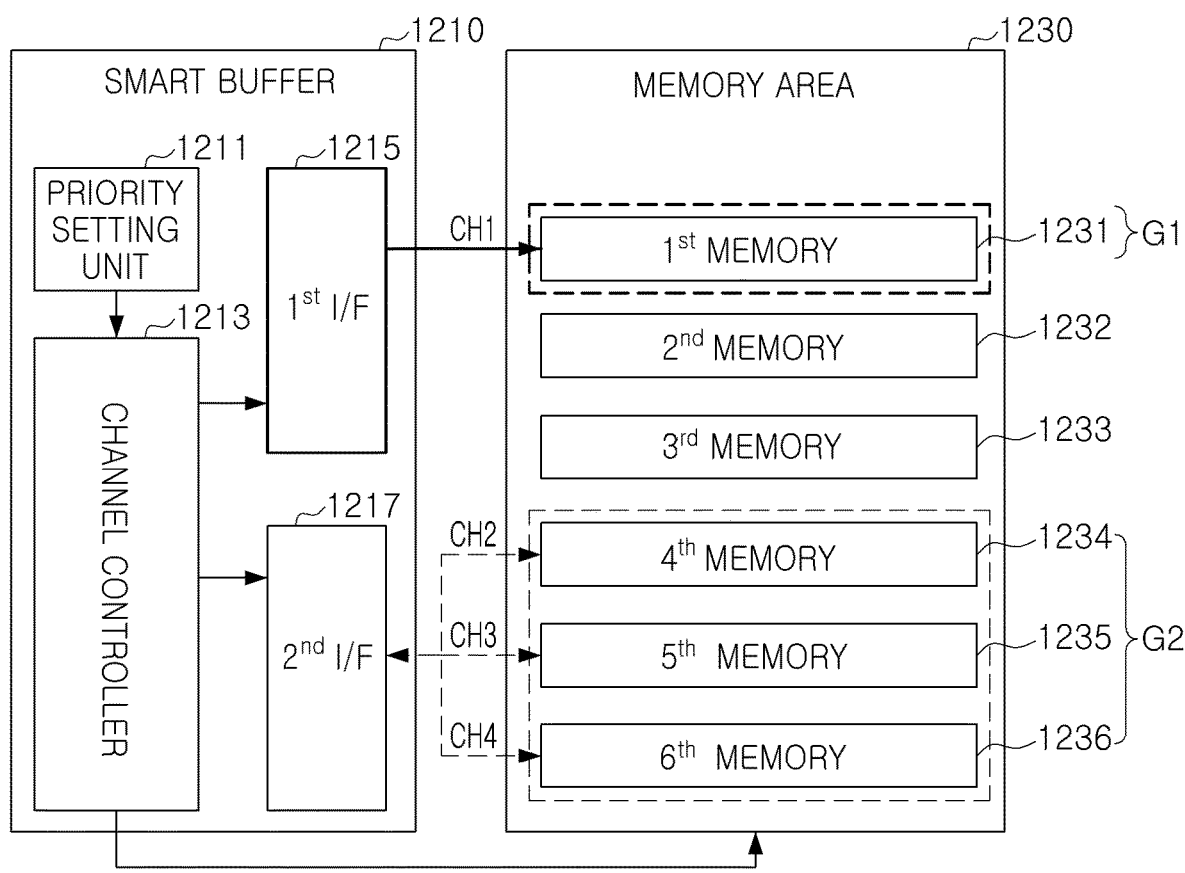
FIGS. 13A and 13B are views illustrating a method of transmitting data to a memory area by a smart buffer according to an embodiment of the inventive concept.
Figure 13B:
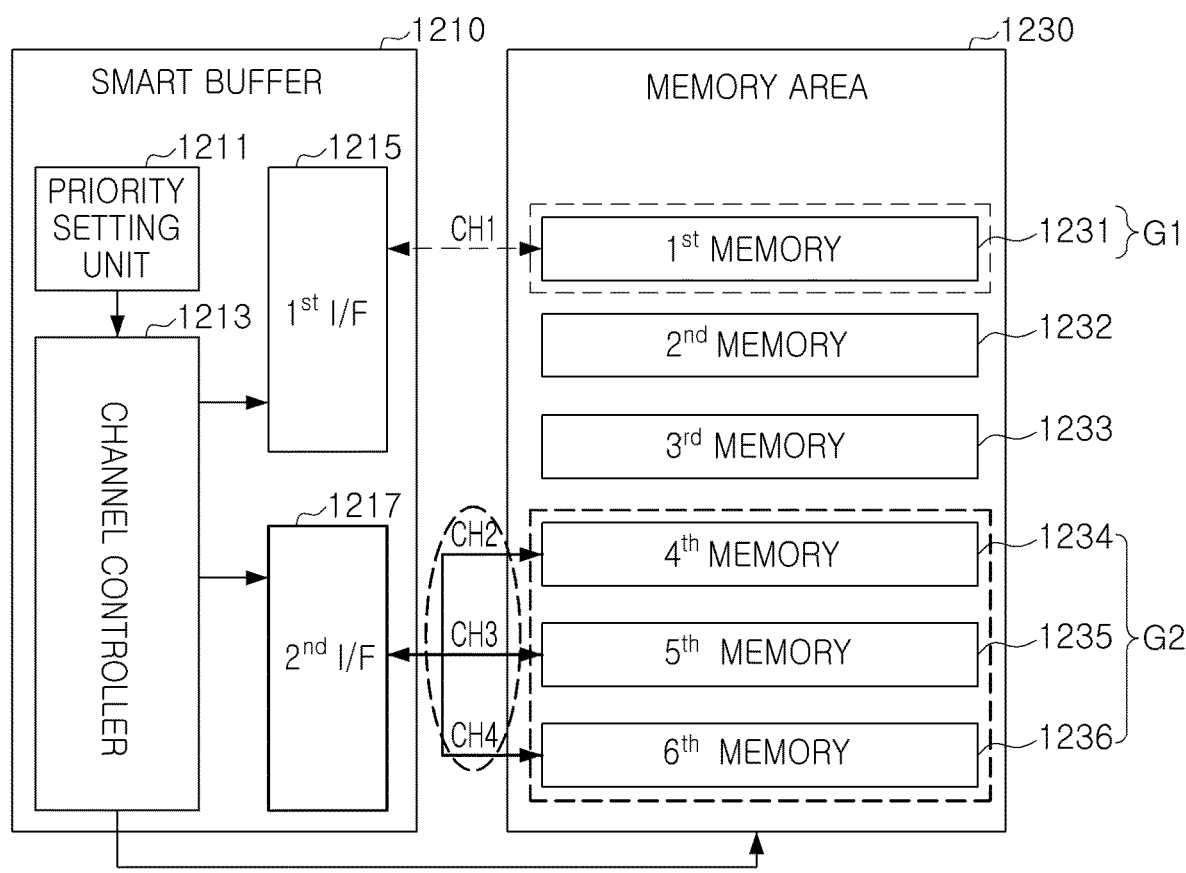

FIGS. 13A and 13B, analogous to FIGS. 5, 6A and 6B, are respective block diagrams illustrating comparative examples of a memory device according to an embodiment of the inventive concept.

Referring to FIG. 13A, a memory device 1200*a* may include a smart buffer 1210 and a memory area 1230, where the smart buffer 1210 includes a priority setting unit 1211, a channel controller 1213, and a plurality of interfaces 1215 and 1217.

The priority setting unit 1211 may use sensing data received from a controller along with corresponding weight (s) mapped to the sensing data in order to set a priority for the sensing data. The priority set by the priority setting unit 1211 for the sensing data may indicate its importance, and may further indicate a memory area in which the sensing data will be stored using an assigned channel allocated to a channel group.

That is, the channel controller 1213 may allocate at least one channel to a channel group and assigned the resulting channel group to the memory area 1230 in view of the given priority of the sensing data. For example, the channel controller 1213 may allocate a first channel CH1 to a first channel group G1 and assign the first channel group to a first memory 1231 in order to store first priority sensing data. In addition, the channel controller 1213 may allocate second, third and fourth channels CH2 to CH4 to a second channel group G2 and respectively assign the second third and fourth channels CH2 to CH4 to the fourth, fifth and sixth memories 1234, 1235 and 1236 in order to store second priority sensing data.

The first channel CH1 may be connected to the first memory 1231 though the first interface 1215, and the second, third and fourth channels CH2, CH3 and CH4 may be respectively connected to the fourth, fifth and sixth memories 1234, 1235 and 1236 through second interface 1217. Here, the channel controller 1213 may control whether the first interface 125 and/or the second interface 1217 are/is activated to transmit the first priority sensing data and/or the second priority sensing data at any given time.

For example, the smart buffer 1210 may activate the first interface 1215 and may deactivate the second interface 1217 to transmit the first priority sensing data to the first memory 1231 through the first channel CH1. In an embodiment, the smart buffer 1210 may serially transmit the first priority sensing data to the first memory 1231 to increase a data transmission speed.

In contrast and referring to FIG. 13B, the smart buffer 1210 may deactivate the first interface 1215 and activate the second interface 1217 in order to transmit the second priority sensing data to the fourth, fifth and to sixth memories 1234, 1235 and 1236 through the second, third and fourth channels CH2 to CH4. In an embodiment, the smart buffer 1210 may transmit the second priority sensing data to the fourth, fifth and sixth memories 1234, 1235 and 1236 using a time division method or a channel interleaving method.

The embodiments illustrated in FIGS. 13A and 13B show the priority setting unit 1211 and the channel controller 1213 as separate system components, however this need not be the case, and in other embodiments of the inventive concept these components may be integrated into a single system component. Alternately or additionally, the priority calculator 1211 may be used to allocates channel among channel groups instead of the channel controller 1213 performing this function. In this case, the priority setting unit 1211 may set the priority of the sensing data using the sensing data and corresponding weights, and may allocate and/or assign at least one channel to process the weighted sensing data in the memory area 1230 according to its priority.

Figure 14:
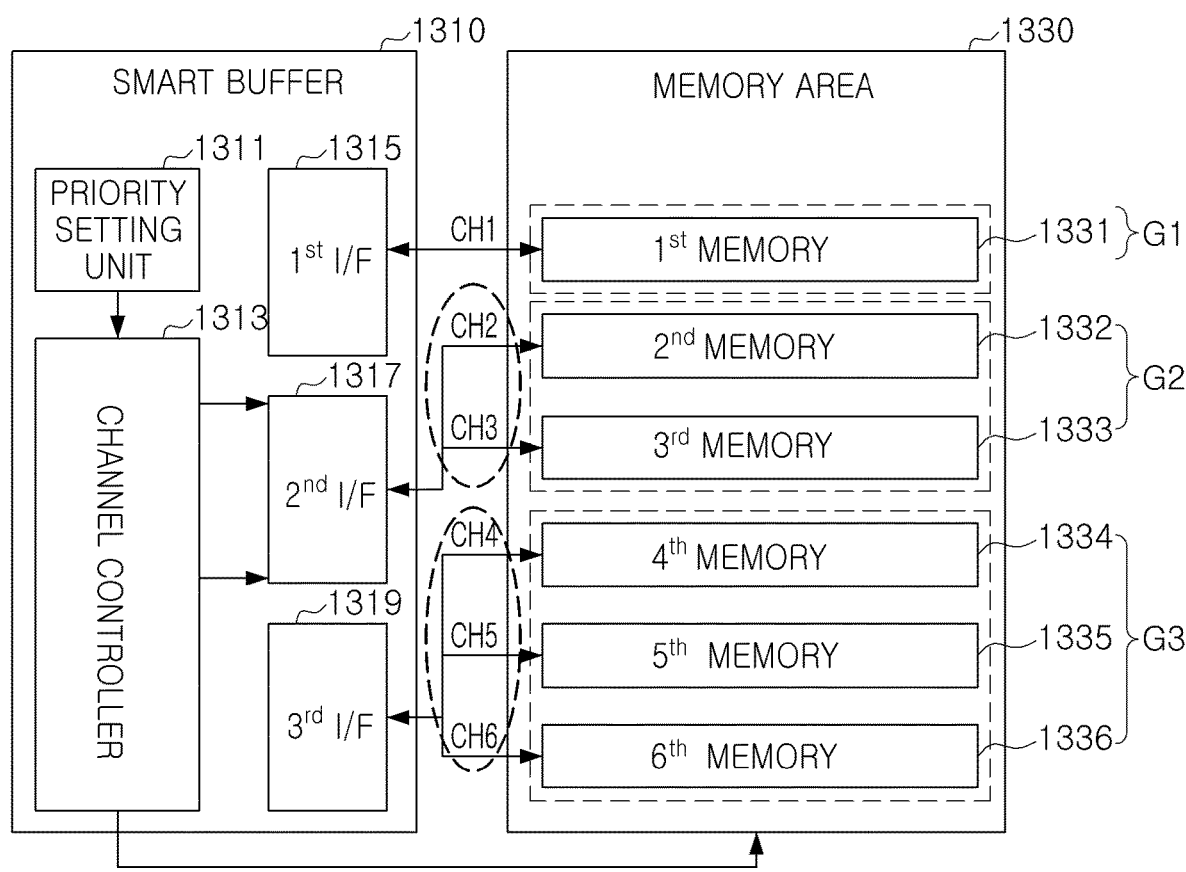
FIG. 14 is a view illustrating a memory device according to an embodiment of the inventive concept.

FIG. 14, analogous to FIGS. 5, 6A, 6B, 13A and 13B, is a block diagram illustrating a memory device 1300 according to an embodiment of the inventive concept.

Referring to FIG. 14, the memory device 1300 may include a smart buffer 1310 and a memory area 1330.

The smart buffer 1310 may include a priority setting unit 1311, a channel controller 1313, and a plurality of interfaces 1315, 1317 and 1319. In addition, the general memory area 1330 may be divided into a plurality of memory areas 1331 through 1336 respectively including a peripheral circuit and a memory cell area.

Here, the channel controller 1313 may allocate one or more channel(s) to one or more channel group(s) and assign the channel group(s) to process weighted sensing data based on a priority of the sensing data, as set (or determined) by the priority setting unit 1311.

For example, when a weight for sensing data transmitted from a controller is greater than or equal to a priority threshold of (e.g.,) 1.2, the priority setting unit 1311 may determine that the sensing data is first priority sensing data. In addition, when a weight of the sensing data is greater than or equal to 0.8 but less than 1.2, the priority setting unit 1311 may determine that the sensing data is second priority sensing data, and when a weight of the sensing data is less than 0.8, the priority setting unit 1311 may determine that the sensing data as third priority sensing data. Here, it is assumed that the first priority sensing data has a high importance, the second priority sensing data has an intermediate importance, and the third priority sensing data has a low importance.

The channel controller 1313 may allocate first channel CH1 to a first channel group G1 and assign the first channel group G1 to process first priority sensing in relation to the first memory 1331 though the first interface 315. The channel controller 1313 may allocate second and third channels CH2 and CH3 to a second channel group G2 and assign the second channel group G2 to process the second priority sensing data in relation to the second and third memories 1332 and 1333 through the second interface 1317. In an embodiment, the second channel CH2 may be assigned to the second memory 1332 and the third channel CH3 may be assigned to the third memory 1333. The channel controller 1313 may allocate fourth, fifth and sixth channels CH4, CH5 and CH6 to a third channel groups G3 and assign the third channel group G3 to process third priority sensing data in relation to fourth, fifth and sixth memories 1334, 1135 and 1336 through the third interface 1319.

The channel controller 1313 may be used to control the activation/deactivation of the first, second and third interfaces 1315 to 1319. For example, the channel controller 1313 may activate the first interface 1315 to transmit first priority sensing data to the first memory area 1331, and deactivate the second and third interfaces 1317 and 1319 to maximize a data transmission speed for the first priority sensing data. When the transmission of the first priority sensing data is complete, the channel controller 1313 may sequentially activate the second interface 1317 and the third interface 1319 to transmit the second priority sensing data and then the third priority sensing data to the memory area 1330.

Here, the transmission of the first priority sensing data may be accomplished using a direct transmission method (e.g., a serial data transmission method), while the transmission of the second priority sensing data and the third priority sensing data may be accomplished using a parallel transmission method such as a time division method or a channel interleaving method. Thus, in certain embodiments, the channel controller 1313 may simultaneously activate the second and third interfaces 1317 and 1319 in order to simultaneously transmit the second and third priority sensing data to assigned memory areas.

Figure 15A:
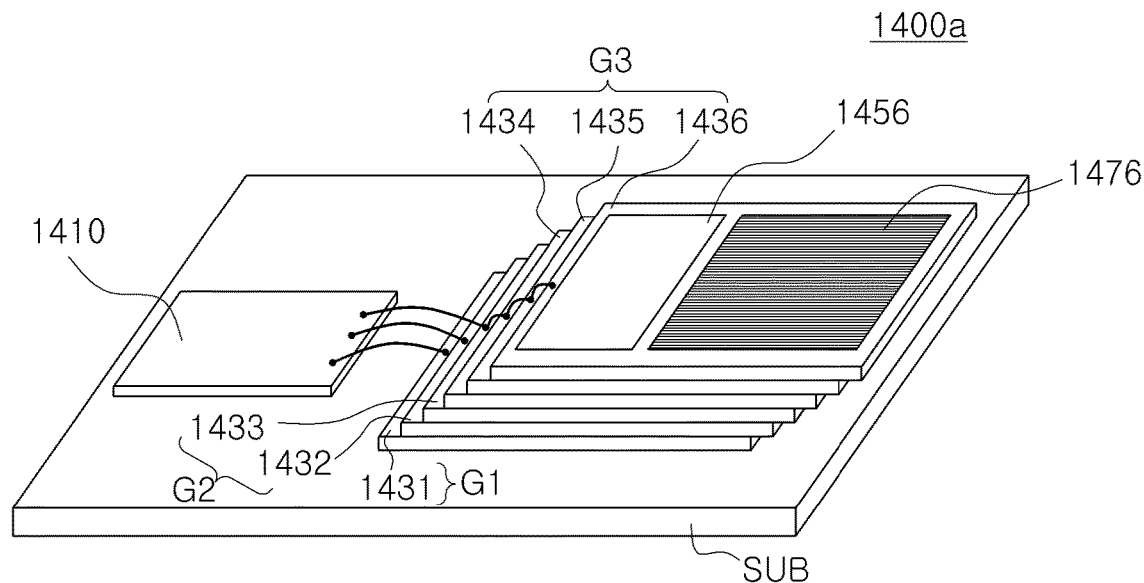
FIGS. 15A and 15B are schematic views illustrating a structure of a memory device according to an embodiment of the inventive concept.
Figure 15B:
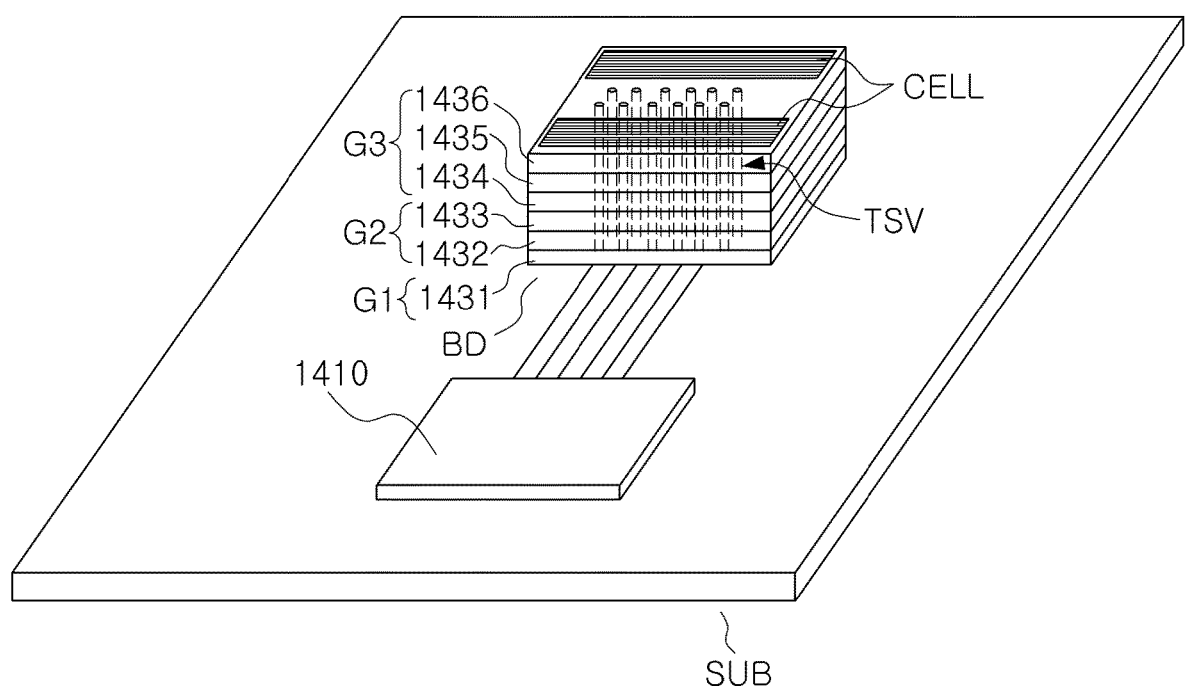

FIGS. 15A and 15B, analogous to FIGS. 10A, 10B, 11A and 11B, are perspective diagrams respectively illustrating possible layouts for a memory device according to embodiments of the inventive concept.

Referring to FIG. 15A, a memory device 1400*a* according to an embodiment of the inventive concept may be implemented as at least one memory package. The memory device 1400*a* may include a package substrate SUB, a smart buffer 1410 and a plurality of memories 1431 to 1436, mounted on the package substrate SUB.

Each of the memories 1431 to 1436 may include a peripheral circuit 1456 and a memory cell area 1476. The memory cell area 1476 may include a plurality of memory cells, and the peripheral circuit 1456 may store data input from the smart buffer 1410 in the plurality of memory cells, or may output data read from the plurality of memory cells.

Extending the working example of FIG. 14, the smart buffer 1410 may be used to classify first, second and third priority sensing data according to priority of the data. In addition, the smart buffer 1410 may variously assign the first, second and third channel groups corresponding to the first, second and third priority sensing data to the memories 1431 to 1436. In this illustrated example, therefore, a particular memory (e.g., 1431) may be regarded as a particular memory area (e.g., the first memory area 1331 of FIG. 14).

Hence, the memories 1431 to 1436 may be respectively assigned to at least one channel of at least one channel group by the smart buffer 1410 using connecting wires. For example, the first memory 1431 assigned to a first channel group G1 may be connected to the smart buffer 1410 through a first wire; the second and third memories 1432 and 1433 respectively assigned to a second channel group G2 may be connected to the smart buffer 1410 through a second wire; and, the fourth, fifth and sixth memories 1434, 1435 and 1436 assigned to a third channel group G3 may be connected to the smart buffer 1410 through a third wire.

Here, however, as the number of memories connected to a particular wire increases, the corresponding data processing load increases. Therefore, a data processing speed and a data transmission speed may increase. For example, a data transfer time for the fourth, fifth and sixth memories 1434, 1435 and 1436 connected to the third wire may be longer than a data transfer time for the second and third memories 1432 and 1433 connected to the second wire. And a data transfer time for the second and third memories 1432 and 1433 connected to the second wire may be longer than a data transfer time for the first memory 1431 connected to the first wire.

Under these assumptions, the smart buffer 1410 may generously allocate channels to a channel group (thereby increased sensing data throughput) assigned to process sensing data having a relatively high importance (or greater weight), and may less generously allocate channels to a channel group assigned to process data having a relatively low importance in view of different data transfer rates, desired data transmission speeds, etc.

Referring to FIG. 15B by way of comparison with the embodiment of FIG. 15A, the memories 1431 to 1436 may be configured as a vertical stack and use various through silicon vias (TSV) as well as connecting wirings disposed in a package substrate SUB, rather than the connecting wires to connected with the smart buffer 1410.

Figure 16:
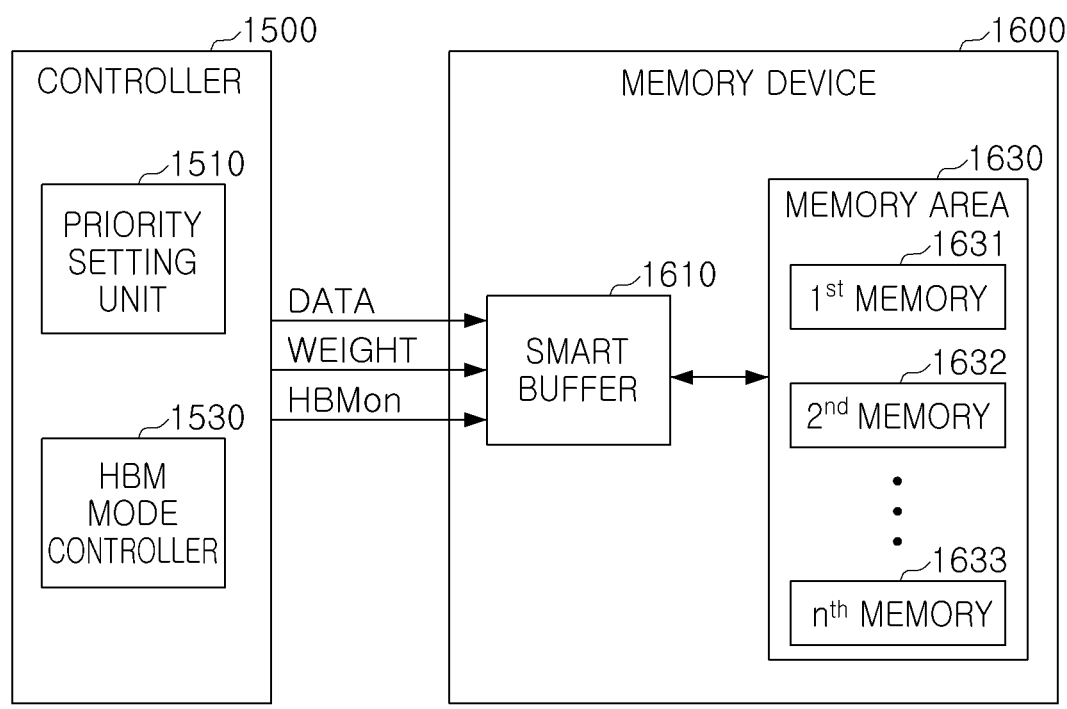
FIG. 16 is a view illustrating a memory system according to an embodiment of the inventive concept.

FIG. 16 is block diagram illustrating a memory system 3 according to an embodiment of the inventive concept, and may be compared with the embodiment of FIG. 2.

Referring to FIG. 16, the memory system 3 may include a controller 1500 and a memory device 1600.

The controller 1500 may include a priority setting unit 1510 and a high bandwidth memory (HBM) mode controller 1530.

As before, the priority setting unit 1510 may assign a weight to sensing data received from an external source, and use the assigned weight to determine a priority of the sensing data. That is, when a weight of data is greater than or equal to a first threshold value, the priority setting unit 1510 may determine that the sensing data is first priority sensing data, and when the weight of data is less than the first threshold value, the priority setting unit 1510 may determine that the sensing data is second priority sensing data.

The priority of data set by the priority setting unit 1510 may be classified in various ways in consideration of requirements for the incorporating host device, the memory system, the memory device, etc. As before, different threshold values may be used by the priority setting unit 1510 to determine the priority of certain weighted sensing data.

Additionally, the priority setting unit 1510 and/or the HBM mode controller 1530 may determine that certain sensing data having a weight greater than or equal to a highest threshold value (e.g., a fourth threshold value (e.g., 1.4)—extending the foregoing examples previously describing the use of first, second and third threshold values) is highest priority sensing data, or HBM sensing data. Upon determining that the sensing data is highest sensing data, the high bandwidth memory (HBM) mode controller may cause the memory device 1600 to operate in accordance with a HBM mode.

When the HBM mode controller 1530 makes a determination to operate in the HBM mode, a HBM mode ON signal (HBMon) and sensing data corresponding thereto may be transferred to the memory device 1600. In this case, the memory device 1600 may store the HBM sensing data in a HBM area in response to the HBMon signal. In an embodiment, the HBM area may be preset in a memory area 1630 of the memory device 1600, and one or more HBM channel(s) may be pre-allocated to a HBM channel group in order to process the HBM sensing data in relation to the HBM area. When operating in the HBM mode, the memory device 1600 may transfer the HBM sensing data to the HBM area using a pre-allocated HBM channel group, including at least one HBM channel.

The memory device 1600 may include a smart buffer 1610 and the memory area 1630, where the smart buffer 1610 and the memory area 1630 are described with reference to FIGS. 17 and 18.

Figure 17:
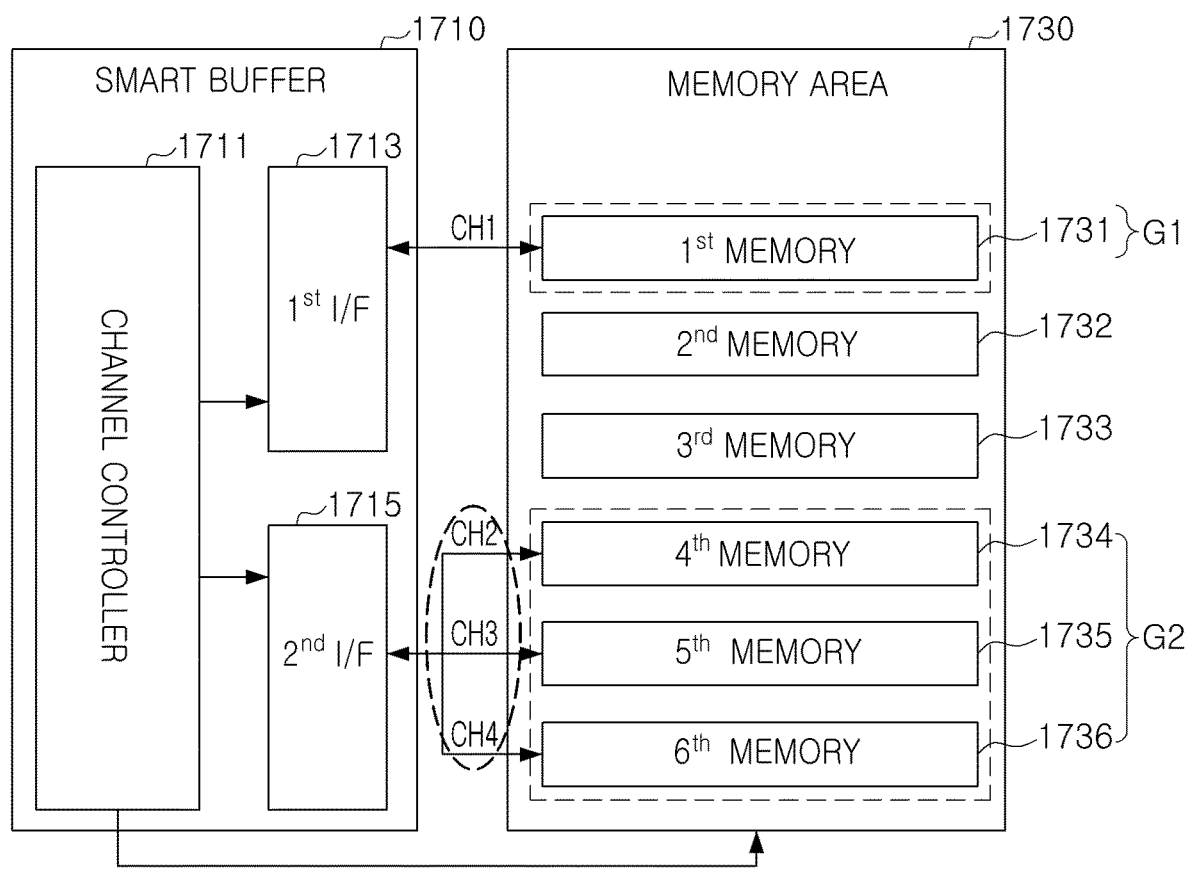
FIGS. 17 and 18 are views illustrating a memory device according to embodiments of the inventive concept.
Figure 18:
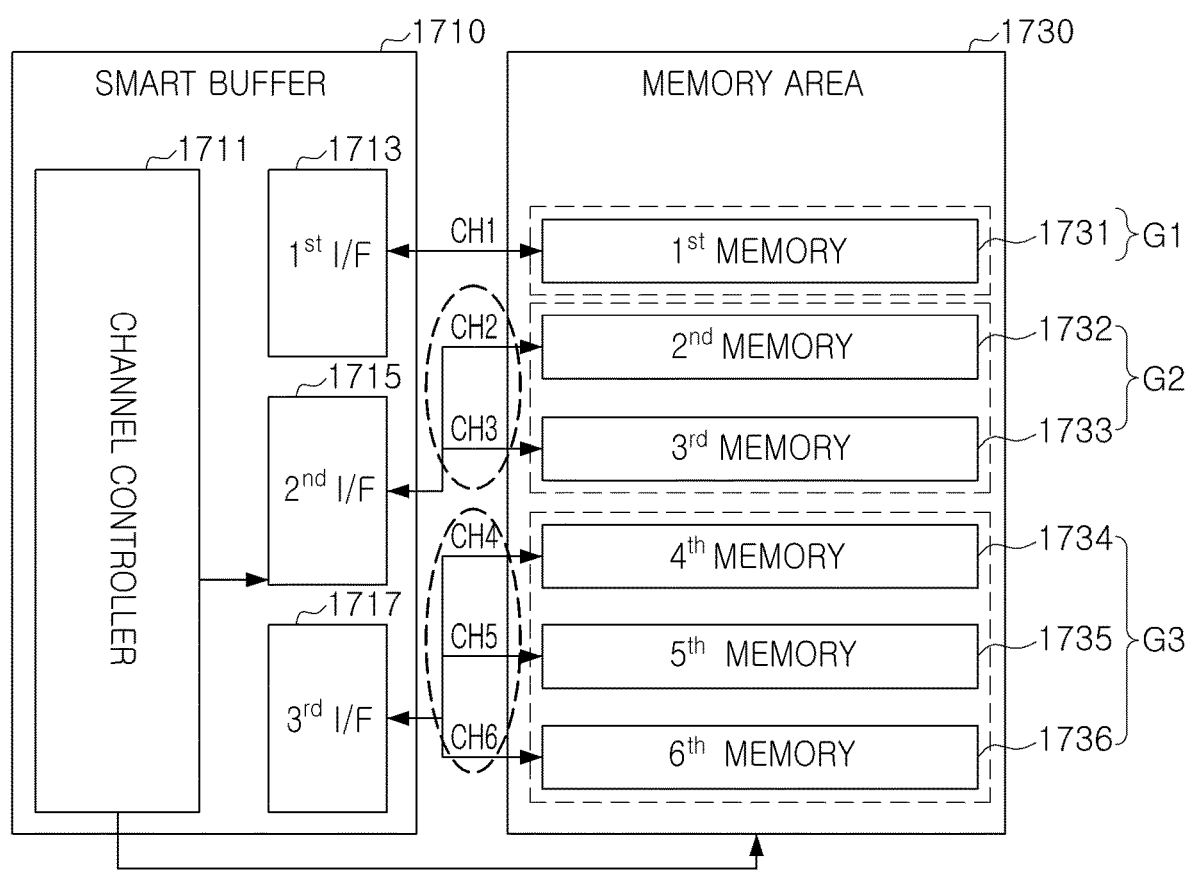

FIGS. 17 and 18 are block diagrams illustrating comparative examples of a memory device according to an embodiment of the inventive concept.

Referring to FIG. 17, a memory device 1700a according to an embodiment of the inventive concept may include a smart buffer 1710 and a general memory area 1730.

The smart buffer 1710 may include a channel controller 1711 and a plurality of interfaces 1713 and 1715.

The channel controller 1711 may allocate and/or assign at least one channel to the general memory area 1730 according to the priority of sensing data received from a controller. For example, the channel controller 1711 may allocate a first channel CH1 (as a first channel group G1) to a first memory 1731 for processing first priority sensing data. In addition, the channel controller 1711 may respectively allocate and assign second, third and fourth channels CH2, CH3 and CH4 (as a second channel group G2) to fourth, fifth and sixth memories 1734, 1735 and 1736 for processing second priority sensing data.

In an embodiment, the first channel group G1 may be configured to operate in relation to the first memory 1731 which is configured to operate as a high bandwidth memory, whereas the second channel group G2 may be configured to operate in relation the fourth, fifth and sixth memories 1734, 1735 and 1736 which are configured to operate as MLC memories (e.g., low-speed, high capacity memories).

Before the HBM mode is activated, only the second channel group G2 may be activated such that data having relatively low importance is transferred to the general memory area 1730 in real time. However, after the HBM mode is activated (e.g., upon receiving the HBMon signal), the first channel group G1 may be activated such that data having much higher importance is transferred to the high bandwidth memory HBM of the general memory area 1730. In an embodiment, the size of the high bandwidth memory HBM included in the first channel group G1 may be dynamically changed, according to capacity of sensing data to be stored using the first channel group G1. As such, the memory device 1700a may reduce overall power consumption by performing a data processing operations using only a portion of the channels, before the HBM mode is activated. In addition, after the HBM mode is activated, the memory device 1700a may further allocate high-speed channels to the high bandwidth memory HBM, and may change the number of the allocated high-speed channels, based on a change in capacity of high importance data or the like, to improve data processing efficiency and improve data processing performance. The smart buffer 1710 of FIG. 17 may include one or more interface(s) (e.g., the first and second interfaces 1713 and 1715).

Referring to FIG. 18, the smart buffer 1710 may include first, second and third interfaces 1713, 1715 and 1717. In this case, the first interface 1713 may be connected to a first channel group G1 allocated to a first memory 1731, the second interface 1715 may be connected to a second channel group G2 allocated to second and third memories 1732 and 1733, and the third interface 1717 may be connected to a third channel group G3 allocated to fourth to sixth memories 1734 to 1736.

In order to store the first priority sensing data, the channel controller 1711 may activate the first interface 1713, and in order to store the second priority sensing data, the channel controller 1711 may activate the second interface 1715.

Figure 19:
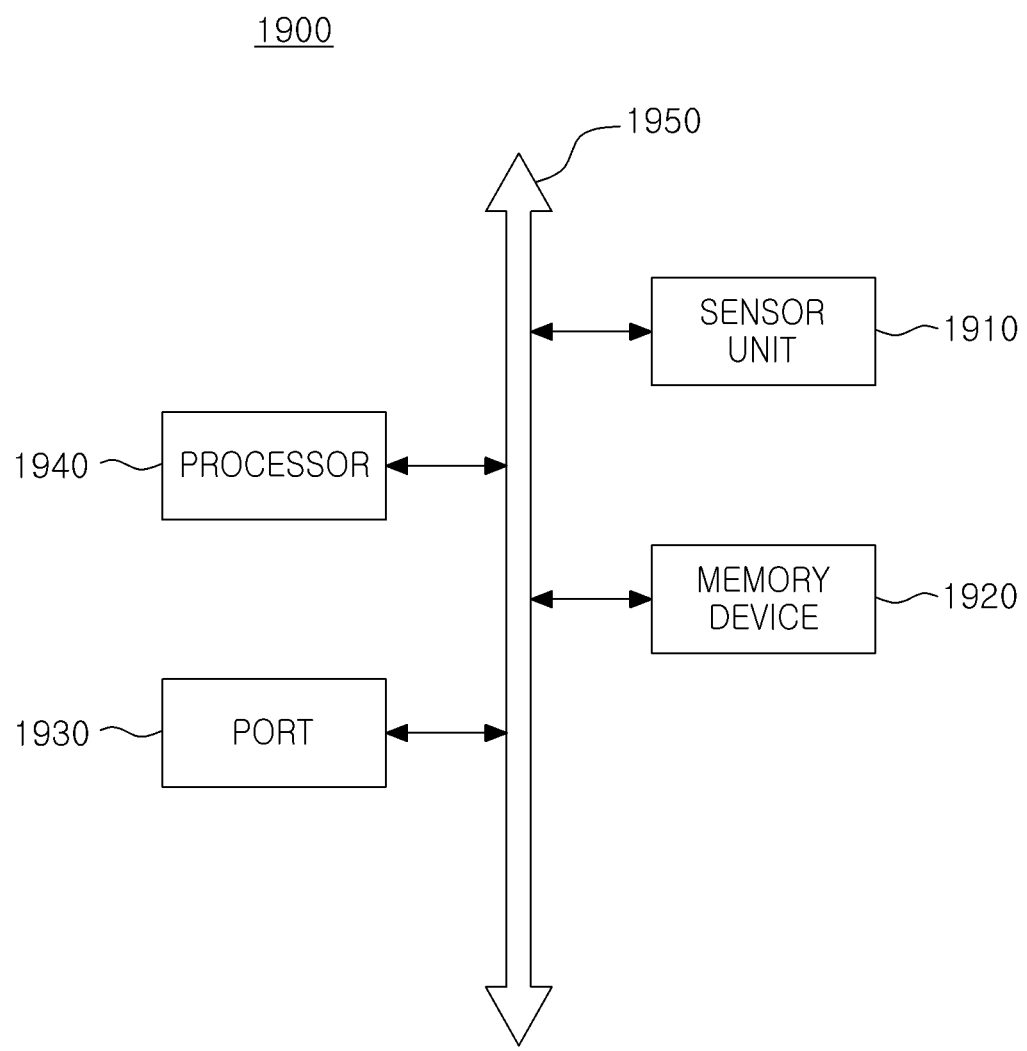
FIG. 19 is a block diagram schematically illustrating an electronic device including a memory device according to embodiments of the inventive concept.

FIG. 19 is a general block diagram illustrating an electronic device including a memory device according to embodiments of the inventive concept.

An electronic device 1900 according to an embodiment illustrated in FIG. 19 may include a sensor unit 1910, a memory device 1920, a port 1930, a processor 1940, and the like. In addition, the electronic device 1900 may further include a wired/wireless communications device, a power supply, or the like. Among the components illustrated in FIG. 19, the port 1930 may be a device provided by the electronic device 1900 to communicate with a video card, a sound card, a memory card, a USB device, and the like. The electronic device 1900 may be a concept encompassing a smartphone, a tablet PC, a smart wearable device, and the like, in addition to a general desktop computer or a laptop computer.

The sensor unit 1910 may include a plurality of sensors, and the plurality of sensors may include an image sensor, an event sensor, an illumination sensor, a GPS device, an acceleration sensor, and the like. The plurality of sensors may be disposed in the electronic device 1900 or may be disposed in a position adjacent to the electronic device 1900 to exchange data through wired or wireless communications.

The processor 1940 may perform specific operations, commands, tasks, and the like. The processor 1940 may be a central processing unit (CPU) or microprocessor unit (MCU), a system on a chip (SoC), or the like, and may communicate with the memory device 1920, as well as with other units connected the port 1930, through a bus 1950. The processor 1940 may include a neural network circuit to calculate a predetermined weight by performing the neural network operation on data collected by the sensor unit 1910. In an embodiment, the neural network circuit may be implemented as a CNN model, an RNN model, or a GaN model.

The memory device 1920 may be a storage medium for storing data necessary for an operation of the electronic device 1900, or multimedia data. The memory device 1920 may include a storage unit based on a semiconductor device. For example, the memory device 1920 may include dynamic random-access memory devices such as a DRAM, a synchronous DRAM (SDRAM), a double data rate SDRAM (DDR SDRAM), a low power double data rate SDRAM (LPDDR SDRAM), a graphics double data rate SDRAM (GDDR SDRAM), a DDR2 SDRAM, a DDR3 SDRAM, a DDR4 SDRAM, or the like, or resistive random-access memory devices such as a phase-change random-access memory (PRAM), a magnetic random-access memory (MRAM), a resistive random-access memory (RRAM), or the like.

In addition, the memory device 1920 may include at least one of a solid state drive (SSD), a hard disk drive (HDD), and an optical drive (ODD) as a storage unit.

In an embodiment, the memory device 1920 may include memory devices according to various embodiments described above with reference to FIGS. 1 to 18.

Figure 20:
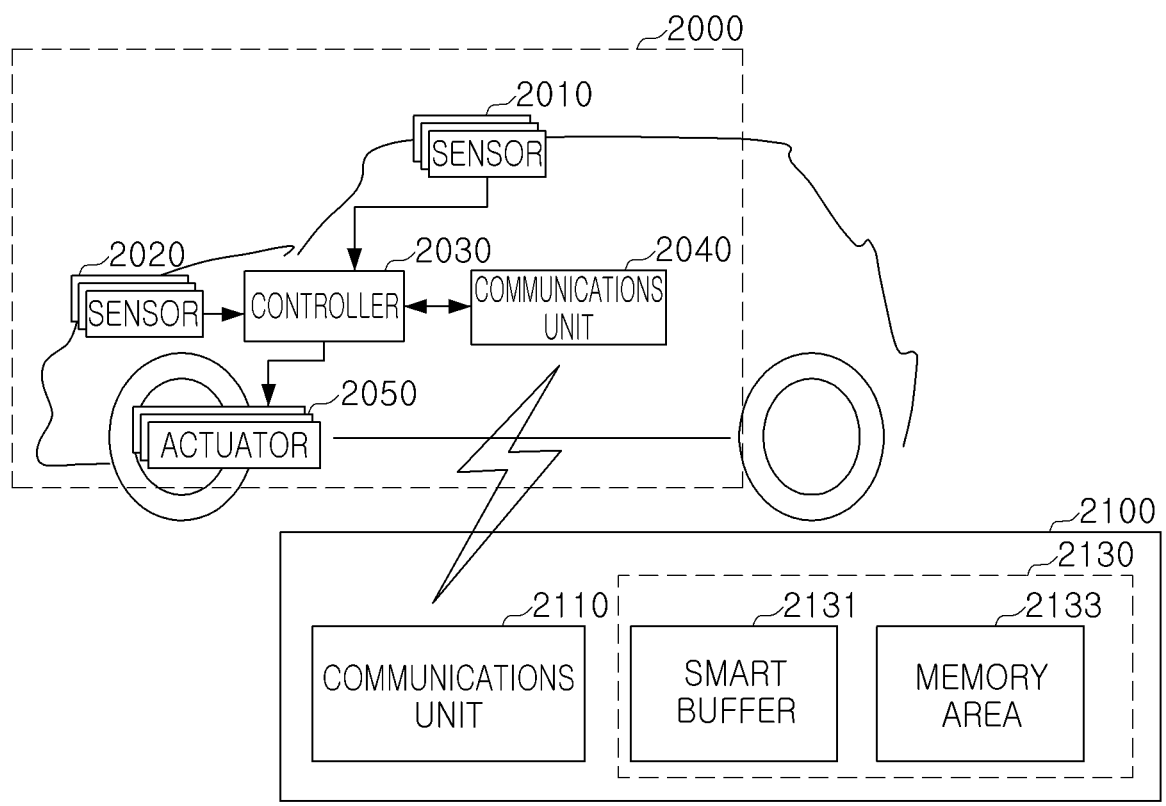
FIG. 20 is a view illustrating an application example of a memory device according to embodiments of the inventive concept.

FIG. 20 is a conceptual diagram illustrating an application example for a memory device according to embodiments of the inventive concept.

Referring to FIG. 20, a memory device 2130 according to embodiments of the inventive concept may be incorporated within a vehicle system.

A vehicle may include a plurality of sensors (e.g., sensor 2010 and sensor 2020) configured to collect various sensing data related to the status or operating conditions of the vehicle as described above.

The controller 2030 may aggregate (e.g., store) various sensing data collected by the sensors 2010 and 2020 in the memory device 2130. In addition, the controller 2030 may drive a plurality of actuators 2050 using the data collected by the plurality of sensors 2010 and 2020, to control the vehicle.

Although the memory device 2130 is implemented in a vehicle, as illustrated in FIG. 20, the memory device 2130 may be implemented outside the vehicle and may perform wireless communications with the controller 2030 using communication units 2040 and 2110.

The memory device 2130 may include a smart buffer 2131 and a memory area 2133, and may be provided as a single memory package.

The smart buffer 2131 may set priority of data according to a weight (or importance) of the data, and may dynamically allocate a channel to the memory area 2133 according to the set priority. The smart buffer 2131 may allocate a high-speed memory area as a channel for data having a relatively high priority, and may allocate a low-speed high capacity memory area as a channel for data having a relatively low priority. Through the above, the smart buffer 2131 may increase a transmission speed for the data having the relatively high priority, and may reduce a transmission speed for the data having the relatively low priority, to efficiently improve processing of data.

The memory device according to the embodiments of the inventive concept may access various sensing data transmitted from the controller, and may be divided to store the sensing data in at least one higher-speed memory area and at least one lower-speed memory area depending on the relative importance of the sensing data.

In addition, the memory device according to the embodiments of the inventive concept may dynamically allocate/assign channels in accordance with many factors as described above.

Various advantages and effects of the inventive concept are not limited to the above description, and may be readily understood upon consideration of foregoing description and the following claims.

While embodiments have been illustrated and described above, it will be apparent to those skilled in the art that modifications and variations could be made without departing from the scope of the inventive concept as defined by the appended claims.

What is claimed is:

1. A memory device comprising:
   a smart buffer; and
   a general memory area divided into a first memory area and a second memory area,
   wherein the smart buffer comprises:
      a priority setting unit configured to receive a sensing data and a corresponding weight from a controller, determine a priority of the sensing data based on the weight, and classify the sensing data as one of first priority sensing data and second priority sensing data; and
      a channel controller configured to allocate at least one channel selected from among a plurality of channels to a first channel group, allocate at least another channel selected from among the plurality of channels to a second channel group, assign the first channel group to process the first priority sensing data in relation to the first memory area, and assign the second channel group to process the second priority sensing data in relation to the second memory area,
   wherein a number of data input/output (I/O) pins connected to the first channel group is greater than a number of data I/O pins connected to the second channel group.

2. The memory device of claim 1, further comprising:
   a first interface configured to connect the at least one channel of the first channel group to the first memory area to transmit the first priority sensing data under control of the channel controller; and
   a second interface configured to connect the at least another channel of the second channel group to the second memory area to transmit the second priority sensing data under control of the channel controller.

3. The memory device of claim 2, wherein the first interface transmits the first priority sensing data to the first memory area in parallel, and the second interface serially transmits the second priority sensing data to the second memory area.

4. The memory device of claim 1, further comprising a mapping table,
wherein the mapping table maps the corresponding weight to the sensing data, and the priority setting unit classifies the sensing data as the first priority sensing data if the corresponding the weight is greater than or equal to a first threshold value.

5. The memory device of claim 1, wherein the first memory area includes at least one of phase-change random-access memory (PRAM) cells, resistive random-access memory (RRAM) cells, and dynamic random-access memory (DRAM) cells, and
the second memory area comprises NAND flash memory cells.

6. The memory device of claim 1, wherein the first memory area comprises memory cells storing N-bit data and the second memory area includes memory cells storing M-bit data, where 'N' and 'M' are natural numbers, and M is greater than N.

7. The memory device of claim 1, wherein the first memory area is implemented on a first semiconductor chip and the second memory area is implemented on at least one second semiconductor chip, different from the first semiconductor chip.

8. The memory device of claim 7, wherein the first semiconductor chip and the at least one second semiconductor chip are vertically stacked, and
the first memory area is connected to the second memory area using a plurality of through silicon vias.

9. The memory device of claim 7, wherein the at least one second semiconductor chip includes a second semiconductor chip and a third semiconductor chip, and
the first semiconductor chip is connected to a first interface of the smart buffer through a first wire, the second semiconductor chip is connected to a second interface through a second wire, and the third semiconductor chip is connected to the second interface through the second wire.

10. The memory device of claim 1, wherein the channel controller allocates the at least one channel to the first channel group, and allocates the at least another channel to the second channel group based on a size of the sensing data.

11. A memory device comprising:
a memory package including a smart buffer and a plurality of semiconductor chips mounted on a semiconductor substrate, wherein the smart buffer is implemented on a semiconductor chip different from the plurality of semiconductor chips and the plurality of semiconductor chips provide a plurality of memory areas including a first memory area and a second memory area,
wherein the smart buffer includes:
a priority setting unit configured to receive a sensing data and a corresponding weight obtained by performing a neural network operation on the sensing data, determine a priority of the sensing data based on the corresponding weight, and classify the sensing data as one of first priority sensing data and second priority sensing data based on the priority; and
a channel controller configured to allocate at least one channel selected from among a plurality of channels to a first channel group, allocate at least another channel selected from among the plurality of channels to a second channel group, assign the first channel group to process the first priority sensing data in relation to the first memory area, and assign the second channel group to process the second priority sensing data in relation to the second memory area.

12. The memory device of claim 11, wherein each one of the plurality of semiconductor chips provides one of the plurality of memory areas.

13. The memory device of claim 11, wherein the smart buffer further includes:
a first interface configured to connect the first channel group to the first memory area and transmit the first priority sensing data at a first data transmission speed; and
a second interface configured to connect the second channel group to the second memory area and transmit the second priority sensing data at a second data transmission speed slower than the first data transmission speed.

14. The memory device of claim 11, wherein at least one of the plurality of semiconductor chips provides a high bandwidth memory (HBM) area.

15. A memory system comprising:
a controller including a weight calculator configured to calculate a corresponding weight for a sensing data using a neural network operation, and a HBM (high bandwidth memory) mode controller configured to generate a HBM mode ON signal when the corresponding weight is greater than a predetermined threshold value; and
a memory device comprising:
a general memory area divided into a plurality of memory areas including a first memory area and a second memory area; and
a smart buffer comprising:
a priority setting unit configured to receive the sensing data and the corresponding weight, determine a priority of the sensing data based on the corresponding weight, and classify the sensing data as one of first priority sensing data and second priority sensing data based on the priority; and
a channel controller configured to allocate at least one channel selected from among a plurality of channels to a first channel group, allocate at least another channel selected from among the plurality of channels to a second channel group, assign the first channel group to process the first priority sensing data in relation to the first memory area, and assign the second channel group to process the second priority sensing data in relation to the second memory area,
wherein the channel controller allocates at least one HBM channel selected from among the plurality of channels to a HBM channel group in response to the HBM mode ON signal, and assigns the HBM channel group to process a HBM sensing data having a priority determined based on the corresponding weight greater than the predetermined threshold value.

16. The memory system of claim 15, wherein when the smart buffer receives the HBM mode ON signal from the controller, the smart buffer controls an amount of a HBM memory area to process the HBM sensing data, based on a change in size of the HBM sensing data.

17. The memory system of claim 15, wherein the memory device comprises a plurality of semiconductor chips which collectively provide the general memory area, a first semiconductor chip among the plurality of semiconductor chips provides the first memory area, and at least two semiconductor chips among the plurality of semiconductor chips, other than the first semiconductor chip, provide the second memory area.

18. The memory system of claim 17, wherein the first semiconductor chip comprises at least one of phase-change random-access memory (PRAM) device, resistive random-access memory (RRAM) device, and dynamic random-access memory (DRAM) device, and the at least two semiconductor chips comprises at least one NAND flash memory device.

19. The memory system of claim 18, wherein the first semiconductor chip and the at least two semiconductor chips are vertically stacked, and the first memory area is connected to the second memory area using through silicon vias.

20. The memory system of claim 18, wherein the first semiconductor chip and each one of the at least two semiconductor chips is respectively connected to the smart buffer with a connecting wire.

\* \* \* \* \*